(12) United States Patent
Sawada

(10) Patent No.: US 8,808,949 B2
(45) Date of Patent: Aug. 19, 2014

(54) DYE DISPERSION LIQUID, PHOTOSENSITIVE RESIN COMPOSITION FOR COLOR FILTERS, COLOR FILTER, LIQUID CRYSTAL DISPLAY DEVICE AND ORGANIC LIGHT EMITTING DISPLAY DEVICE

(75) Inventor: Masanori Sawada, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 14/113,689

(22) PCT Filed: Apr. 25, 2012

(86) PCT No.: PCT/JP2012/061093
§ 371 (c)(1),
(2), (4) Date: Jan. 6, 2014

(87) PCT Pub. No.: WO2012/147795
PCT Pub. Date: Nov. 1, 2012

(65) Prior Publication Data
US 2014/0125930 A1    May 8, 2014

(30) Foreign Application Priority Data
Apr. 28, 2011   (JP) ................................ 2011-101020

(51) Int. Cl.
*G03F 7/004* (2006.01)
*G02B 5/20* (2006.01)

(52) U.S. Cl.
USPC ............ 430/7; 430/270.1; 349/106; 313/504

(58) Field of Classification Search
None
See application file for complete search history.

(56) References Cited

U.S. PATENT DOCUMENTS

| 5,169,672 A * | 12/1992 | Harima et al. ................ 427/458 |
| 2003/0172847 A1 | 9/2003 | He et al. |
| 2004/0009414 A1 * | 1/2004 | Araki ................................. 430/7 |
| 2009/0108241 A1 | 4/2009 | Ogura et al. |

FOREIGN PATENT DOCUMENTS

| JP | 2004-501911 A | 1/2004 |
| JP | 2004-067715 A | 3/2004 |
| JP | 2004-339368 A | 12/2004 |
| JP | 2008-242414 A | 10/2008 |
| JP | 2009-242695 A | 10/2009 |
| JP | 2009-251586 A | 10/2009 |
| JP | 2009-265267 A | 11/2009 |
| JP | 2010-032999 A | 2/2010 |
| JP | 4492760 B1 | 6/2010 |
| JP | 2010-235747 A | 10/2010 |
| WO | 2007/034963 A1 | 3/2007 |
| WO | 2011/108496 A1 | 9/2011 |

* cited by examiner

*Primary Examiner* — John A. McPherson
(74) *Attorney, Agent, or Firm* — Ladas & Parry LLP

(57) ABSTRACT

A photosensitive resin composition comprising a dye (A), a dispersant (B), a solvent (C), and a photosensitive binder component (D), the dye (A) being dispersed in the solvent (C) by the dispersant (B), wherein the dye (A) is a dye having a sulfonic acid group; the dispersant (B) is a block polymer that contains a block portion comprising a repeating unit having a tertiary amine; the solvent (C) is a solvent having a solubility of the dye (A) of 0.2 (g/100 g solvent) or less at 23° C.; and a micelle is formed by an acid-base interaction between the tertiary amine of the dispersant (B) and the sulfonic acid group of the dye (A).

11 Claims, 2 Drawing Sheets

DYE DISPERSION LIQUID, PHOTOSENSITIVE RESIN COMPOSITION FOR COLOR FILTERS, COLOR FILTER, LIQUID CRYSTAL DISPLAY DEVICE AND ORGANIC LIGHT EMITTING DISPLAY DEVICE

TECHNICAL FIELD

The present invention relates to a dye dispersion liquid, a photosensitive resin composition for color filters, a color filter, a liquid crystal display device and an organic light emitting display device.

BACKGROUND ART

In recent years, many thin image display devices as typified by displays, so-called flat panel displays, have been placed on the market, due to such characteristics that they are thinner than cathode-ray tube displays and do not take a large width space. With the advances in production technology, their market price has become reasonable year by year. There has been a growing demand for them, and their production volume has been increasing year by year. Especially, liquid crystal displays have almost reached the mainstream of TVs. Also recently, organic light-emitting display devices such as organic EL displays have been drawing attention as a next-generation image display device, which emits light by itself and thus provides high visibility. Better performances are strongly required of these display devices, such as higher image quality (e.g., advanced contrast and color reproducibility) and lower power consumption.

A color filter is used in these liquid crystal display devices and organic light-emitting display devices. For example, in the case of color liquid crystal displays, colors are produced in the following manner: a back light is used as light source; liquid crystal is electrically driven to control the amount of light; and the light passes through a color filter to produce colors. In liquid crystal TVs, therefore, a color filter is necessary to produce colors, and it plays a major part in influencing display performance. In organic light-emitting display devices, a color image is formed in the same manner as liquid crystal display devices, when a color filter is used in combination with an organic, white light-emitting element.

As a trend in recent years, there has been a demand for power-saving image display devices. To improve backlight use efficiency, there is a strong demand for high-luminance color filters. This is a significant issue, especially for mobile displays (cellular phones, smart phones and tablet PCs).

Although technological advances have provided an improvement in battery capacity, there is still a limit on battery capacity of mobile devices. On the other hand, along with an expansion in display size, power consumption tends to increase. Image display devices comprising a color filter are directly linked to the available battery time of mobile devices or to the charging frequency of batteries in mobile devices, so that they determine the design and performance of mobile devices.

In general, a color filter comprises a transparent substrate, a color layer formed on the substrate and comprising color patterns in three primary colors of red, green and blue, and a light shielding part formed on the transparent substrate to separate the color patterns from each other.

A pigment dispersion method has been widely used for forming such a color layer, in which a pigment with excellent heat resistance and light resistance is used as a colorant.

However, it has been getting difficult for color filters formed with a pigment to meet the recent demand for higher luminance.

As a means of achieving higher luminance, photosensitive resin compositions for color filters comprising a dye have been studied. In general, dyes have higher transparency than pigments and enable the production of high-luminance color filters. However, dyes are poor in heat resistance and light resistance and have a problem that the chromaticity is likely to change when heated at high temperature in color filter production process. Also, there is a problem that photosensitive resin compositions comprising a dye are likely to form aggregates in drying process. The aggregates formed in a coating film significantly deteriorate the contrast of the film, making it difficult to use the film as a color layer.

Also, dyes in which the molecules have a salt structure have excellent solubility in polar solvents, that is, solvents as typified by water and alcohols, and they have poor solubility in non-polar solvents or low-polar solvents as typified by propylene glycol monomethyl ether acetate (hereinafter may be simply referred to as PGMEA).

PGMEA or the like has been widely used in pigment-containing photosensitive resin compositions, for the reasons of low risk to human body, excellent heat-drying properties while having low volatility at or around room temperature, etc. Also, a photosensitive resin composition containing large amounts of solvents with very different polarities is problematic in that a washing process is further needed when switched from a conventional PGMEA-containing photosensitive resin composition. In addition, photosensitive resin compositions containing large amounts of polar solvents are not preferable since, due to water absorption, etc., they may cause problems such as unevenness or aggregates upon drying, and there are concerns about production problems. For these reasons, even in the case of dye-containing photosensitive resin compositions, it is demanded to use non-polar solvents or low-polar solvents such as PGMEA and not to contain polar solvents such as water and alcohol.

Moreover, in color filter production process, it is required that the solid content in a photosensitive resin composition has excellent re-dissolubility in solvents. "Re-dissolubility in solvents" means such a property that the solid content of a photosensitive resin composition once dried, is re-dissoluble in solvents. Poor re-dissolubility makes it difficult to remove or clean up a dried product of the photosensitive resin composition attached in color filter production. To improve productivity, there is also a demand for improvement in alkaline developability.

As a dye-containing photosensitive resin composition for color filters, a blue colored composition is disclosed in Patent Literature 1, the composition comprising a blue pigment and a salt-forming compound comprising a xanthene acid dye and a quaternary ammonium salt compound. According to Patent Literature 1, it is explained that there is an improvement in heat resistance, light resistance and solvent resistance as a result of adsorption of the salt-forming xanthene acid dye on the blue pigment. That is, this effect is obtained by having a pigment, and even if a salt-forming compound derived from a dye is used alone or a dispersion of the compound with an acryl resin is used, the solubility of the blue colored composition in PGMEA is not sufficient, and the blue colored composition has a problem of poor optical properties due to color unevenness caused in or aggregates formed in coating film formation.

As a means of increasing the luminance of color filters, a photosensitive resin composition is disclosed in Patent Literature 2, the composition comprising the following as colorants: an organic pigment and a specific, organic solvent-soluble dye comprising xanthene as the basic skeleton. However, in the case of the photosensitive resin composition according to Patent Literature 2, the dye is dissolved in 4-hydroxy-4-methyl-2-pentanone for use, and the heat resistance is obtained by containing the organic pigment.

CITATION LIST

Patent Literature 1: Patent No. JP 4,492,760
Patent Literature 2: Japanese Patent Application Laid-Open No. 2010-32999

SUMMARY OF INVENTION

Technical Problem

The present invention was achieved in light of the above circumstances. The object of the present invention is to provide the following: a dye dispersion liquid configured to achieve higher luminance, to form no aggregates in coating film formation, to have excellent re-dissolubility in solvents, and to be able to form a coating film with excellent heat resistance and light resistance; a photosensitive resin composition for color filters, configured to cause no color unevenness in or form no aggregates in coating film formation, to have excellent re-dissolubility in solvents and excellent alkaline developability, and to be able to form a high-luminance color layer with excellent heat resistance and light resistance; a color filter comprising the photosensitive resin composition for color filters; a liquid crystal display device comprising the color filter; and an organic light-emitting display device comprising the color filter.

Solution to Problem

As a result of diligent researches made to achieve the above object, the inventor of the present invention has found the following: by dispersing a dye having a sulfonic acid group in a solvent in which the dye is hardly soluble or substantially insoluble, such as propylene glycol monomethyl ether acetate, with a specific dispersant having a tertiary amine, it is possible to homogeneously disperse the dye in the state of particles; to achieve heat resistance and light resistance even in the case where no pigment is contained; to form no aggregates in coating film formation; to improve re-dissolubility in solvents; and to improve alkaline developability.

The present invention was completed based on this finding.

The dye dispersion liquid according to the present invention comprises a dye (A), a dispersant (B) and a solvent (C), the dye (A) being dispersed in the solvent (C) by the dispersant (B), wherein the dye (A) is a dye having a sulfonic acid group; the dispersant (B) is a block polymer that contains a block portion comprising a repeating unit having a tertiary amine; the solvent (C) is a solvent having a solubility of the dye (A) of 0.2 (g/100 g solvent) or less at 23° C.; and a micelle is formed by an acid-base interaction between the tertiary amine of the dispersant (B) and the sulfonic acid group of the dye (A).

It is preferable that a ratio of a product of an acid value (a) [mg KOH/g] of the dye (A) having a sulfonic acid group and a solid content weight (Wa) [g] of the dye (A) to a product of an amine value (b) [mg KOH/g] of the dispersant (B) and a solid content weight (Wb) [g] of the dispersant (B), satisfies $0.45 < (a \times Wa)/(b \times Wb) \leq 1$, from the viewpoint of improving dye dispersibility and dispersion stability, achieving higher luminance, obtaining excellent re-dissolubility in solvents and excellent alkaline developability, and being able to form a coating film with excellent heat resistance and light resistance.

It is preferable that the amine value (b) of the dispersant (B) is 60 to 180 mg KOH/g, from the viewpoint of achieving higher luminance, obtaining excellent re-dissolubility in solvents and excellent alkaline developability, and being able to form a coating film with excellent heat resistance and light resistance.

It is preferable that the dye (A) is a dye comprising xanthene, anthraquinone or phthalocyanine as a basic skeleton and having a sulfonic acid group, from the viewpoint of achieving higher luminance, obtaining excellent re-dissolubility in solvents and excellent alkaline developability, being able to form a coating film with excellent heat resistance and light resistance, and achieving a desired chromaticity easily.

It is preferable that in the dispersant (B), the repeating unit having a tertiary amine is a structure represented by the following formula (I), from the viewpoint of achieving higher luminance, obtaining excellent re-dissolubility in solvents and excellent alkaline developability, and being able to form a coating film with excellent heat resistance and light resistance:

wherein $R^1$ is a hydrogen atom or a methyl group; "A" is a direct bond or a divalent linking group; $R^2$ is an alkylene group having 1 to 8 carbon atoms or a divalent organic group described by $-[CH(R^6)-CH(R^7)-O]_x-CH(R^6)-CH(R^7)-$ or $-[(CH_2)_y-O]_z-(CH_2)_y-$; each of $R^3$ and $R^4$ is independently a chain and/or cyclic hydrocarbon group which can be substituted, or $R^3$ and $R^4$ are bound to each other to form a cyclic structure; each of $R^6$ and $R^7$ is independently a hydrogen atom or a methyl group; "x" is an integer of 1 to 18; "y" is an integer of 1 to 5; and "z" is an integer of 1 to 18.

It is preferable that a number of the repeating units having a tertiary amine in the block polymer is 3 to 50, the block polymer being the dispersant (B), from the viewpoint of achieving higher luminance, obtaining excellent re-dissolubility in solvents and excellent alkaline developability, and being excellent in heat resistance and light resistance.

It is preferable that the dye (A) is a dye having a sulfonic acid group converted from at least one sulfonic acid salt of at least one kind of dye selected from the group consisting of Acid Red 289, Acid Violet 43, Acid Green 25 and Direct Blue 86, from the viewpoint of achieving higher luminance, obtaining excellent re-dissolubility in solvents and excellent alkaline developability, and being able to form a coating film with excellent heat resistance and light resistance.

It is preferable that 50% by weight or more of the solvent (C) is propylene glycol monomethyl ether acetate, from the viewpoint of achieving higher luminance, obtaining excellent re-dissolubility in solvents and excellent alkaline developability, and being able to form a coating film with excellent heat resistance and light resistance.

The photosensitive resin composition for color filters according to the present invention, comprises at least the dye dispersion liquid of the present invention and a photosensitive binder component (D).

The present invention provides a color filter comprising at least a transparent substrate and color layers, the color layers being present on the transparent substrate, wherein at least one of the color layers is a cured product of the photosensitive resin composition for color filters.

Also, the present invention provides a liquid crystal display device comprising the color filter, a counter substrate and a liquid crystal layer, the liquid crystal layer being present between the color filter and the counter substrate.

Also, the present invention provides an organic light emitting display device comprising the color filter and an organic light emitting material.

Advantageous Effects of Invention

According to the present invention, it is possible to provide the following: a dye dispersion liquid configured to achieve higher luminance, to form no aggregates in coating film formation, to have excellent re-dissolubility in solvents, and to be able to form a coating film with excellent heat resistance and light resistance; a photosensitive resin composition for color filters, configured to form no aggregates in coating film formation, to have excellent re-dissolubility in solvents and excellent alkaline developability, and to be able to form a high-luminance color layer with excellent heat resistance and light resistance; a color filter comprising the photosensitive resin composition for color filters; a liquid crystal display device comprising the color filter; and an organic light-emitting display device comprising the color filter.

DESCRIPTION OF EMBODIMENTS

Figure 1:
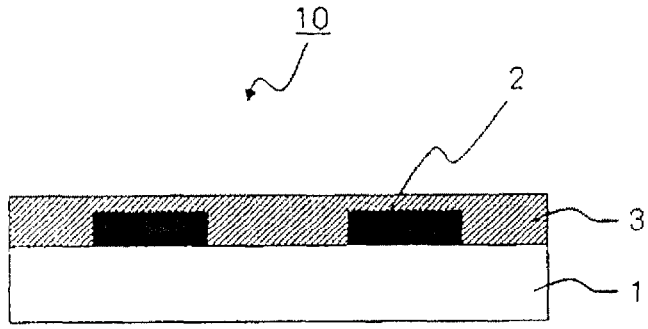
FIG. 1 is a schematic view showing an example of the color filter according to the present invention.

Hereinafter, the dye dispersion liquid according to the present invention, the photosensitive resin composition for color filters according to the present invention, the color filter according to the present invention, the liquid crystal display device according to the present invention, and the organic light-emitting display device according to the present invention, will be explained in order.

In the present invention, "light" encompasses electromagnetic waves in visible and non-visible wavelength ranges and radial rays. Radial rays include microwaves and electron beams, more specifically, electromagnetic waves having a wavelength of 5 μm or less and electron beams. Also in the present invention, "(meth)acryl" means any one of acryl and methacryl, and "(meth)acrylate" means any one of acrylate and methacrylate.

Acid Red, Acid Violet, Acid Green and Direct Blue may be simply referred to as "AR", "AV", "AG" and "DB", respectively.

1. Dye Dispersion Liquid

The dye dispersion liquid according to the present invention comprises a dye (A), a dispersant (B) and a solvent (C), the dye (A) being dispersed in the solvent (C) by the dispersant (B), wherein the dye (A) is a dye having a sulfonic acid group; the dispersant (B) is a block polymer that contains a block portion comprising a repeating unit having a tertiary amine; the solvent (C) is a solvent having a solubility of the dye (A) of 0.2 (g/100 g solvent) or less at 23° C.; and a micelle is formed by an acid-base interaction between the tertiary amine of the dispersant (B) and the sulfonic acid group of the dye (A).

Because the above-specified dye (A) is dispersed in the above-specified solvent (C) by the above-specified dispersant (B), the dye dispersion liquid according to the present invention is a dye dispersion liquid which achieves higher luminance, forms no aggregates in coating film formation, has excellent re-dissolubility in solvents and excellent alkaline developability, and is able to form a coating film with excellent heat resistance and light resistance.

The mechanism that the dye dispersion liquid according to the present invention produces these effects due to the dispersion of the above-specified dye (A) in the above-specified solvent (C) by the above-specified dispersant (B), is assumed as follows.

The solvent (C) used in the present invention is a solvent in which the dye (A) is hardly soluble or substantially insoluble; therefore, the dye can be dispersed in the solvent, in the state of fine particles. The dye dispersed in the state of fine particles is an aggregate at the molecular level; therefore, it is presumed that ion-pair dissociation or decomposition is unlikely to occur in the dye, and the heat resistance and light resistance of the dye is higher than those of dyes dissolved in solutions. In the case of the dye in the state of fine particles, the dispersibility and dispersion stability in solvents can be increased by, like pigments, using a dispersant.

The dye (A) used in the present invention is a dye having a sulfonic acid group, and the dispersant (B) used in the present invention is a block polymer that contains a block portion comprising a repeating unit having a tertiary amine. It is presumed that by using the dye (A) in combination with the dispersant (B), an acid-base interaction occurs between the sulfonic acid group in the dye molecule and the tertiary amine in the dispersant, thus fixing the dye to the tertiary amine in the dispersant for stabilization. It is presumed that such a stabilization state of the dye (A) and the dispersant (B) is a state in which, centering around each dye (A) particle, the dye affinity sites (sites having an affinity for the dye) of the dispersant surround the dye particle, while the solvent affinity sites (sites having an affinity for the solvent) of the dispersant (B) are located outside thereof. That is, the stabilization state is presumed to be a state in which a micelle is formed by the dye and the dispersant. In the dye dispersion liquid of the present invention, in the manner explained above, the dye can be homogeneously dispersed in the solvent, in a finely dispersed state and in the form of fine particles surrounded by the dispersant. Accordingly, a coating film can be obtained by the use of the dye dispersion liquid, which has high transparency because the dye in the dye dispersion liquid can keep its inherent color, and which can achieve higher luminance because the dye in the liquid is finely dispersed.

In addition, because the above stabilization state of the dye (A) and the dispersant (B) is maintained even in the drying process of coating film formation, it is presumed that dye-derived aggregates are not formed in coating film formation, in the case of using the dye dispersion liquid of the present invention. Also, the above stabilization state of the dye (A) and the dispersant (B) is maintained even when the photosensitive resin composition comprising the dye dispersion liquid of the present invention, is formed into a dried coating film; therefore, it is presumed that the coating film thus obtained shows excellent re-dissolubility in non-polar solvents or low-polar solvents or such as PGMEA, is shown. Because a micelle is formed by the dye (A) having a sulfonic acid group and the dispersant (B) having a tertiary amine, it is presumed that the photosensitive resin composition comprising the dye dispersion liquid thus obtained can blend well with alkali developers and has better alkaline developability, compared with the case of using an ammonium-ion containing dispersant, for example. It is also presumed that the above stabilization state of the dye (A) and the dispersant (B) further improves the heat resistance and light resistance of the coating film.

In the present invention, "re-dissolubility" encompasses not only the case where the solid content in the photosensitive resin composition is completely dissolved in the solvent, but also the case where the solid content is dispersed in the solvent, in the form of fine particles. The solvent used for re-dissolution is typically a solvent used in the photosensitive resin composition. However, re-dissolubility in solvents that are typically used in photosensitive resin compositions, such as PGMEA, is also a required property.

In the present invention, as described above, the dye is not dissolved in the solvent and is finely dispersed in the solvent in which the dye is substantially insoluble or hardly soluble for use. Therefore, it is possible to prepare the photosensitive resin composition, using a low- or non-polar solvent in which dyes are usually insoluble, such as PGMEA, as a main component of the solvent.

The dye dispersion liquid of the present invention comprises at least the dye (A), the dispersant (B) and the solvent (C). It may further comprise other compound(s), as needed.

Hereinafter, the components of the dye dispersion liquid of the present invention will be described in detail.

[Dye (A)]

The dye (A) used in the present invention is a dye having a sulfonic acid group.

By using the dye having a sulfonic acid group in combination with the dispersant (B) described below, an acid-base interaction occurs between the dye (A) and the dispersant (B), so that the dye can be homogeneously dispersed in the solvent, in a finely dispersed state.

The dye (A) is not particularly limited as long as is a dye having a sulfonic acid group. The examples include acid dyes having a sulfonic acid group, direct dyes having a sulfonic acid group, dyes having a sulfonic acid group converted from at least one sulfonic acid salt of acid dyes, and dyes having a sulfonic acid group converted from at least one sulfonic acid salt of direct dyes. Preferred is a dye in which all sulfonic acid salts contained have been converted to sulfonic acid groups, from the viewpoint of increasing dispersion stability by the acid-base interaction of the dispersant on the tertiary amine sites.

The method for converting at least one sulfonic acid salt of the dye having a sulfonic acid salt to a sulfonic acid group, is not particularly limited. The examples include methods such as an acid treatment method using a weak acid releasing reaction and a method using a cation exchange resin.

As the acid treatment method, for example, there may be mentioned a method of converting sulfonic acid salt to sulfonic acid group, in which the dye having a sulfonic acid salt is dissolved in a solvent that is acid-soluble and is a good solvent for dyes, such as methanol, and mixed with an acid to convert the sulfonic acid salt to a sulfonic acid group. The acid used in this method is not particularly limited as long as it has higher acidity than acids in which the sulfonic acid salt has been converted to a sulfonic acid group. Although depending on the dye used, acids with a wide range of applications include hydrochloric acid, sulfuric acid, nitric acid, p-toluenesulfonic acid (PTS) and trifluoromethanesulfonic acid, for example. On the other hand, as the ion exchange resin used in the method using a cation exchange resin, there may be mentioned a sulfonic acid-terminal cation exchange resin, etc., such as DIAION PK-216H (product name; manufactured by Mitsubishi Chemical Corporation). Sulfonating treatment of the dye having sulfonic acid salt can be carried out at the time of preparing the dispersion liquid. For example, it can be carried out after dissolving the dye in a good solvent; thereafter, PGMEA or the dispersant is added thereto, without collecting the dye having a sulfonic acid group in a solid form. Or, after sulfonation of the dye, the dye having a sulfonic acid group is collected in the form of solid by a reprecipitation or recrystallization method; thereafter, the dispersion liquid can be prepared. From the viewpoint of recovery rate of the dye (A), the former method is preferred.

The solvent for the photosensitive resin composition is suitably PGMEA. Accordingly, among dyes (A), it is preferable to select a dye which has a sulfonic acid group and which is substantially insoluble or hardly soluble in PGMEA. In the case of a dye having multiple ionic groups, as long as at least one sulfonic acid group is present per molecule, the dye can be a dye salt in which salt is formed by the rest of the ionic groups and other ionic compound. In this case, the other ionic compound may be colored or colorless and may be an organic or inorganic compound.

From the viewpoint of heat resistance upon adjusting the chromaticity of the color layer of a color filter to a target chromaticity, the dye (A) is preferably a dye comprising xanthene, anthraquinone or phthalocyanine as a basic skeleton.

Examples of dyes having a sulfonic acid group and/or a sulfonic acid salt and comprising xanthene, anthraquinone or phthalocyanine as the basic skeleton, are as follows: xanthene dyes such as Acid Red 52 and Acid Red 289; anthraquinone dyes such as Acid Red 80, Acid Green 25, Acid Green 27, Acid Blue 25, Acid Blue 78, Acid Blue 112, Acid Blue 182, Acid Violet 34 and Acid Violet 43; phthalocyanine dyes such as Direct Blue 86, Direct Blue 87 and Acid Blue 249.

In the case of using a dye having a sulfonic acid salt, prior to or at the time of preparing the dye dispersion liquid, at least one sulfonic acid salt is converted to a sulfonic acid group to make the dye into the dye (A) having a sulfonic acid group.

From the viewpoints of achieving higher luminance, obtaining excellent re-dissolubility in solvents, and being able to form a coating film with excellent heat resistance and heat resistance, it is more preferable that the dye (A) is a dye having a sulfonic acid group converted from at least one sulfonic acid salt of at least one kind of dye selected from the group consisting of Acid Red 289, Acid Violet 43, Acid Green 25 and Direct Blue 86, all of which dyes being represented by the following formulae:

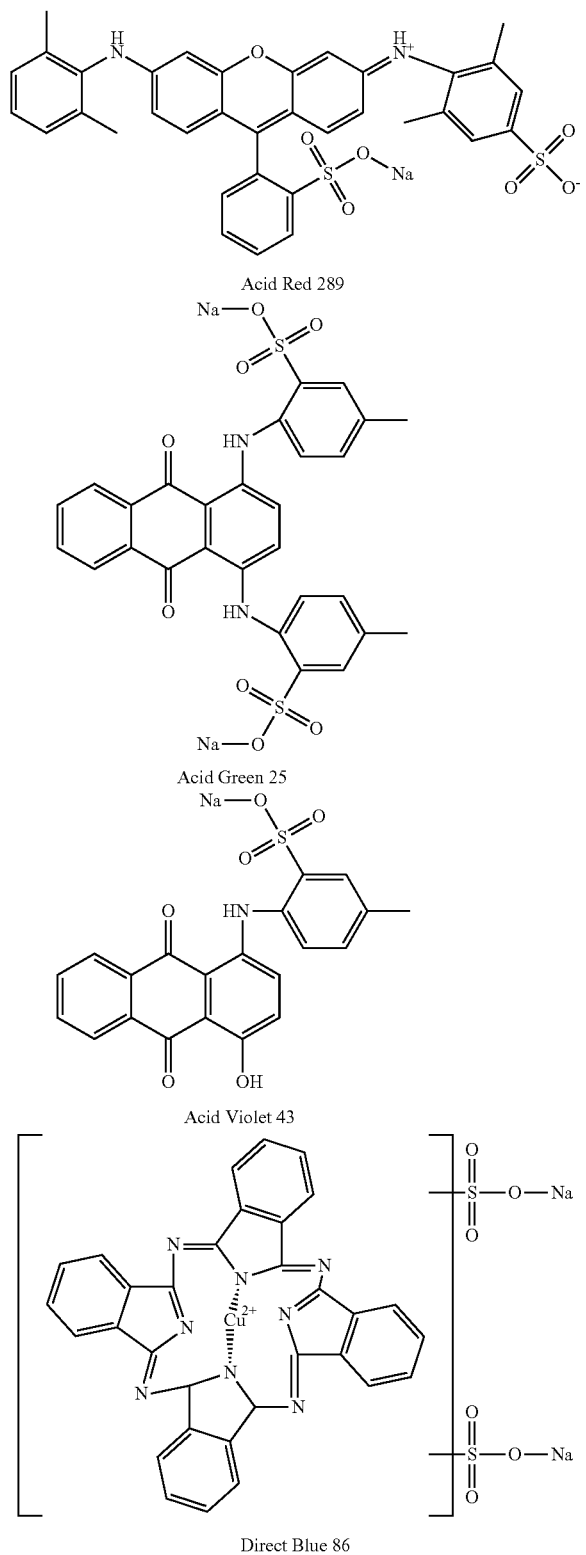

Acid Red 289

Acid Green 25

Acid Violet 43

Direct Blue 86

<Acid Value (a) of Dye (A)>

The acid value (a) of the dye (A) having a sulfonic acid group is not particularly limited, as long as it is larger than 0. However, from the viewpoint of stability of the micelle formed by the dye (A) and the block polymer having a tertiary amine, the acid value (a) is preferably 10 to 300 mg KOH/g.

"Acid value" means the number of milligrams (mg) of potassium hydroxide that is required to neutralize an acid component contained per gram of sample. It can be obtained by the method defined in JIS-K0070.

<Particle Diameter of the Micelle Formed by the Dye and Dispersant>

The average dispersed particle diameter of the micelles formed by the dye and dispersant used in the present invention, is not particularly limited, as long as the color layer formed from the dye dispersion liquid shows a desired color. From the viewpoint of preventing a decrease in contrast, the average dispersed particle diameter is preferably in the range of 10 to 100 nm, more preferably in the range of 10 to 80 nm. When the average dispersed particle diameter of the micelles is in these ranges, high quality is provided to the liquid crystal display device and organic light-emitting display device produced with the photosensitive resin composition of the present invention.

The average dispersed particle diameter of the micelles formed by the dye (A) and the dispersant (B) in the dye dispersion liquid, is the dispersed particle diameter of micelle particles dispersed in a dispersion medium, the micelle particles being formed by dyes and dispersants and the dispersion medium comprising at least a solvent. The average dispersed particle diameter is measured with a laser scattering particle size distribution analyzer. The particle diameter can be obtained as follows, for example: the dye dispersion liquid is appropriately diluted with a solvent to a concentration that is measurable with the laser scattering particle size distribution analyzer (e.g., 1,000 times), the solvent being the same as the one used in the dye dispersion liquid, and then the particle diameter is measured with a laser scattering particle size distribution analyzer (e.g., Nanotrac Particle Size Analyzer UPA-EX150 manufactured by Nikkiso Co., Ltd.) by dynamic light scattering at 23° C. The "average dispersed particle diameter" used in the present invention is volume average particle diameter.

In the dye dispersion liquid of the present invention, the dye (A) used may be just one kind of dye or may be a combination of two or more kinds of dyes.

In the dye dispersion liquid of the present invention, the content of the dye (A) is not particularly limited. In general, the content is preferably in the range of 1 to 40% by weight, more preferably in the range of 1 to 20% by weight, relative to the total amount of the dye dispersion liquid.

[Dispersant (B)]

The dispersant (B) used in the present invention is a block polymer that contains a block portion comprising a repeating unit having a tertiary amine. In the present invention, the dispersant (B) is used not only for dispersing the dye (A) successfully, but also for obtaining a dye dispersion liquid configured to form no aggregates in coating film formation, to have excellent re-dissolubility in solvents, and to be able to form a coating film with excellent heat resistance and light resistance, by using in combination with the dye (A).

In the dispersant (B), the block portion comprising a repeating unit having a tertiary amine, has an affinity for the dye (A), and it is a part that functions to cause an acid-base interaction to occur between the tertiary amine of the dispersant (B) and the sulfonic acid group of the dye (A). By containing such a block portion, there is an improvement in dye stability and in heat resistance and light resistance; moreover, when formed into a coating film, excellent alkaline developability and excellent curability are provided to the coating film.

The dispersant (B) will be explained hereinafter, with reference to the block portion and other block portion of the dispersant.

<Block Portion Comprising a Repeating Unit Having a Tertiary Amine>

The repeating unit which constitutes the block polymer that contains a block portion comprising a repeating unit having a tertiary amine, is only required to have a tertiary amine. The tertiary amine can be contained in a side chain of the block polymer or may be a constituent of the main chain.

From the viewpoint of obtaining excellent heat resistance and light resistance and improving re-dissolubility, the tertiary amine is preferably contained in a side chain of the block polymer. From the point of view that the main chain skeleton is resistance to thermal decomposition and thus has high heat resistance, it is more preferable that the repeating unit having a tertiary amine is a structure represented by the following formula (I):

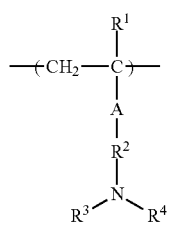

(I)

wherein $R^1$ is a hydrogen atom or a methyl group; "A" is a direct bond or a divalent linking group; $R^2$ is an alkylene group having 1 to 8 carbon atoms or a divalent organic group described by —[CH($R^6$)—CH($R^7$)—O]$_x$—CH($R^6$)—CH($R^1$)— or —[(CH$_2$)$_y$—O]$_z$—(CH$_2$)$_y$—; each of $R^3$ and $R^4$ is independently a chain and/or cyclic hydrocarbon group which can be substituted, or $R^3$ and $R^4$ are bound to each other to form a cyclic structure; each of $R^6$ and $R^7$ is independently a hydrogen atom or a methyl group; "x" is an integer of 1 to 18; "y" is an integer of 1 to 5; and "z" is an integer of 1 to 18.

Examples of the divalent linking group "A" in the formula (I) include an alkylene group having 1 to 10 carbon atoms, an arylene group, a —CONH— group, a —COO— group, an ether group having 1 to 10 carbon atoms (—R'—OR"— wherein each of R' and R" is independently an alkylene group) and combinations thereof. From the viewpoint of being a relatively inexpensive raw material and of the heat resistance and solubility in PGMEA of the thus-obtained polymer, "A" is preferably a —COO— group, and the repeating unit constituting the block portion comprising a repeating unit having a tertiary amine is a structure represented by the following formula (I'):

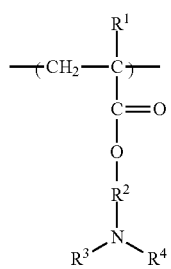

(I')

wherein $R^1$ is a hydrogen atom or a methyl group; $R^2$ is an alkylene group having 1 to 8 carbon atoms or a divalent organic group described by —[CH($R^6$)—CH($R^7$)—O]$_x$—CH($R^6$)—CH($R^7$)— or —[(CH$_2$)$_y$—O]$_z$—(CH$_2$)$_y$—; each of $R^3$ and $R^4$ is independently a chain and/or cyclic hydrocarbon group which can be substituted, or $R^3$ and $R^4$ are bound to each other to form a cyclic structure; each of $R^6$ and $R^7$ is independently a hydrogen atom or a methyl group; "x" is an integer of 1 to 18; "y" is an integer of 1 to 5; and "z" is an integer of 1 to 18.

The divalent organic group $R^2$ in the above formulae (I) and (I') is one selected from the group consisting of an alkylene group having 1 to 8 carbon atoms, —[CH($R^6$)—CH($R^7$)—O]$_x$—CH($R^6$)—CH($R^7$)— and —[(CH$_2$)$_y$—O]$_z$—(CH$_2$)$_y$—. The alkylene group having 1 to 8 carbon atoms can be in any one of a straight-chain form and a branched form. The examples of the alkylene group include a methylene group, an ethylene group, a trimethylene group, a propylene group, various kinds of butylene groups, various kinds of pentylene groups, various kinds of hexylene groups and various kinds of octylene groups.

Each of $R^6$ and $R^7$ is independently a hydrogen atom or a methyl group. Also, "x" is an integer of 1 to 18, preferably an integer of 1 to 4, more preferably an integer of 1 to 2. Then, "y" is an integer of 1 to 5, preferably an integer of 1 to 4, more preferably an integer of 2 or 3. Finally, "z" is an integer of 1 to 18, preferably an integer of 1 to 4, more preferably an integer of 1 or 2.

From the viewpoint of dispersibility, $R^2$ is preferably an alkylene group having 1 to 8 carbon atoms, more preferably one selected from the group consisting of a methylene group, an ethylene group, a propylene group and a butylene group, and still more preferably a methylene group or ethylene group.

In the formulae (I) and (I'), as the cyclic structure formed by $R^3$ and $R^4$ bound to each other, there may be mentioned 5-7 membered, nitrogen-containing mono-heterocyclic rings and condensed rings formed condensation of two of the mono-heterocyclic rings, for example. The nitrogen containing heterocyclic rings are preferably non-aromatic rings, and more preferably saturated rings. As the cyclic structure formed by $R^3$ and $R^4$ in the formulae (I) and (I'), for example, there may be mentioned those represented by the following formula (II):

(II)

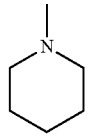

(II-1)

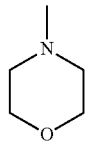

(II-2)

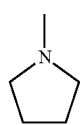

(II-3)

The cyclic structure formed by $R^3$ and $R^4$ can further have a substituent. Groups preferred as the substituent between $R^3$ and $R^4$ are an alkyl group which has 1 to 3 carbon atoms and which can have a substituent, an aralkyl group which can have a substituent, and a phenyl group which can have a substituent.

For $R^3$ and $R^4$, an example of the chain hydrocarbon group is an alkyl group having 1 to 8 carbon atoms. Examples of the alkyl group having 1 to 8 carbon atoms include a methyl group, an ethyl group, a propyl group, a butyl group, a pentyl group, a hexyl group, an octyl group, an isopropyl group, a tert-butyl group and a 2-ethylhexyl group. Examples of cycloalkyl groups include a cyclopentyl group, a cyclohexyl group and a cyclooctyl group. Of them, preferred are a methyl group and an ethyl group.

As the repeating unit represented by the formula (I), for example, there may be mentioned repeating units derived from (meth)acryloyloxypropyldimethylamine, (meth)acryloyloxyethyldimethylamine, (meth)acryloyloxypropyldiethylamine and (meth)acryloyloxyethyldiethylamine. However, the repeating unit is not limited to these examples.

In the block portion, a number of the repeating units having a tertiary amine is preferably 3 or more. From the viewpoint of obtaining excellent dispersibility, obtaining excellent heat resistance and light resistance, and improving curability, the number is preferably 3 to 50, more preferably 6 to 40, still more preferably 10 to 30.

The repeating unit having a tertiary amine is only required to function as a site having an affinity for the dye and may be one kind or a combination of two or more kinds.

<Other Block Portion>

From the viewpoint of improving dispersibility, it is preferable that the dispersant (B) used in the present invention further comprises a block portion having an affinity for the solvent, in addition to the above-described block portion comprising a repeating unit having a tertiary amine.

From the viewpoint of obtaining excellent solvent affinity and improving dispersibility, it is preferable that the other block portion contained in the block polymer, which is the dispersant (B), is appropriately selected from repeating units derived from non-basic monomers, depending on the solvent, so as to have solvent affinity. "Non-basic monomer" is a polymerizable monomer which gives a solution with a pH of 7.1 or lower when dissolved in water at 25° C., at a concentration of 0.1 N (or saturated concentration when it is less than 0.1 N). Examples of the other block portion contained in the block polymer, which is the dispersant (B), include polymers of unsaturated carboxylic esters, such as polyacrylic acid ester, and polymers of carboxylic acids, such as polyacrylic acid. From the viewpoint of improving dye dispersibility and dispersion stability and also improving heat resistance, the other block portion is more preferably a polymer having a repeating unit represented by the following chemical formula (III). Still more preferably, the other block portion is a structure represented by the following formula (III'), from the viewpoint of solubility in PGMEA, affinity for binder polymer and polyfunctional acrylate when formed into a photosensitive resin composition, and resistance to coloration upon post-baking.

In the formula (III), $R^{10}$ is a hydrogen atom or a methyl group; "A" is a direct bond or a divalent linking group; $R^{11}$ is one selected from the group consisting of an alkyl group having 1 to 18 carbon atoms, an alkenyl group having 2 to 18 carbon atoms, an aralkyl group, an aryl group and a monovalent group described by $-[CH(R^{12})-CH(R^{13})-O]_x-R^{14}$ or $-[(CH_2)_y-O]_z-R^{14}$; each of $R^{12}$ and $R^{13}$ is independently a hydrogen atom or a methyl group; $R^{14}$ is one selected from the group consisting of a hydrogen atom, an alkyl group having 1 to 18 carbon atoms, an alkenyl group having 2 to 18 carbon atoms, an aralkyl group, an aryl group and a monovalent group described by $-CHO$, $-CH_2CHO$ or $-CH_2COOR^{15}$; $R^{15}$ is a hydrogen atom or a straight-chain, branched or cyclic alkyl group having 1 to 5 carbon atoms; "x" is an integer of 1 to 18; "y" is an integer of 1 to 5; "z" is an integer of 1 to 18; "m" is an integer of 3 to 200; and "n" is an integer of 10 to 200.

In the formula (III'), $R^{10}$ is a hydrogen atom or a methyl group; $R^{11}$ is one selected from the group consisting of an alkyl group having 1 to 18 carbon atoms, an alkenyl group having 2 to 18 carbon atoms, an aralkyl group, an aryl group and a monovalent group described by $-[CH(R^{12})-CH(R^{13})-O]_x-R^{14}$ or $-[(CH_2)_y-O]_z-R^{14}$; each of $R^{12}$ and $R^{13}$ is independently a hydrogen atom or a methyl group; $R^{14}$ is one selected from the group consisting of a hydrogen atom, an alkyl group having 1 to 18 carbon atoms, an alkenyl group having 2 to 18 carbon atoms, an aralkyl group, an aryl group and a monovalent group described by $-CHO$, $-CH_2CHO$ or $-CH_2COOR^{15}$; and $R^{15}$ is a hydrogen atom or a straight-chain, branched or cyclic alkyl group having 1 to 5 carbon atoms.

Also, "x" is an integer of 1 to 18; "y" is an integer of 1 to 5; "z" is an integer of 1 to 18; "m" is an integer of 3 to 200; and "n" is an integer of 10 to 200.

In the formula (III), "A" can be the same as that of the formula (I).

In the formulae (III) and (III'), $R^{11}$ is one selected from the group consisting of an alkyl group having 1 to 18 carbon atoms, an alkenyl group having 2 to 18 carbon atoms, an aralkyl group, an aryl group, $-[CH(R^{12})-CH(R^{13})-O]_x-R^{14}$ and $-[(CH_2)_y-O]_z-R^{14}$.

The alkyl group having 1 to 18 carbon atoms can be in any one of straight-chain, branched and cyclic forms, and the examples include a methyl group, an ethyl group, an n-propyl group, an isopropyl group, an n-butyl group, an isobutyl group, a sec-butyl group, a tert-butyl group, various kinds of pentyl groups, various kinds of hexyl groups, various kinds of octyl groups, various kinds of decyl groups, various kinds of dodecyl groups, various kinds of tetradecyl groups, various kinds of hexadecyl groups, various kinds of octadecyl groups, a cyclopentyl group, a cyclohexyl group, a cyclooctyl group, a cyclododecyl group, a bornyl group, an isobornyl group, a dicyclopentanyl group, an adamantyl group, and a lower alkyl group-substituted adamantyl group.

The alkenyl group having 2 to 18 carbon atoms can be in any one of straight-chain, branched and cyclic forms. Examples of such alkenyl groups include a vinyl group, an allyl group, a propenyl group, various kinds of butenyl groups, various kinds of hexenyl groups, various kinds of octenyl groups, various kinds of decenyl groups, various kinds of dodecenyl groups, various kinds of tetradecenyl groups, various kinds of hexadecenyl groups, various kinds of octadecenyl groups, a cyclopentenyl group, a cyclohexenyl group and a cyclooctenyl group. In the alkenyl group, the position of the double bond is not limited. However, from the viewpoint of the reactivity of the thus-obtained polymer, it is preferable that the double bond is present at the terminal end of the alkenyl group.

As the aryl group which can have a substituent, there may be mentioned a phenyl group, a biphenyl group, a naphthyl group, a tolyl group and a xylyl group. The number of carbon atoms the aryl group has, is preferably 6 to 24, more preferably 6 to 12.

As the aralkyl group which can have a substituent, there may be mentioned a benzyl group, a phenethyl group, a naphthylmethyl group and a biphenylmethyl group. The number of carbon atoms the aralkyl group has, is preferably 7 to 20, more preferably 7 to 14.

As the substituent of an aromatic ring such as an aryl group or aralkyl group, there may be mentioned a straight-chain or branched alkyl group having 1 to 4 carbon atoms, an alkenyl group, a nitro group and a halogen atom.

The above-mentioned preferred number of carbon atoms, does not include the number of substituents.

Also, $R^{14}$ is one selected from the group consisting of a hydrogen atom, an alkyl group having 1 to 18 carbon atoms, an alkenyl group having 2 to 18 carbon atoms, an aralkyl group, an aryl group and a monovalent group described by —CHO, —CH$_2$CHO or —CH$_2$COOR$^{15}$, all of which groups can have a substituent. $R^{15}$ is a hydrogen atom or a straight-chain, branched or cyclic alkyl group having 1 to 5 carbon atoms.

For the monovalent group explained in the above $R^{14}$, examples of the substituent that the group can have include a straight-chain, branched or cyclic alkyl group having 1 to 4 carbon atoms and halogen atoms such as F, Cl and Br.

Of the examples of $R^{14}$, the alkyl group having 1 to 18 carbon atoms, the alkenyl group having 2 to 18 carbon atoms, the aralkyl group and the aryl group are as shown in the above $R^{11}$.

For $R^{11}$, "x," "y" and "z" are as explained in the above $R^2$.

In the general formulae (III) and (III'), multiple $R^{11}$ in the repeating units may be the same or different from each other.

As $R^{11}$, it is preferable to use one with excellent solubility in the below-described solvent. In particular, depending on the repeating unit which constitutes the block copolymer, etc., $R^{11}$ is preferably a methyl group, an ethyl group, an n-butyl group, a 2-ethylhexyl group, a benzyl group or the like, when the solvent used is an ether alcohol acetate-based solvent, an ether-based solvent, an ester-based solvent or the like, which are solvents that are generally used as solvents for color filters.

Also, to the extent that does not impair the dispersibility, etc., of the block copolymer, $R^{11}$ can be one substituted by a substituent such as an alkoxy group, a hydroxyl group, a carboxyl group, an amino group, an epoxy group, an isocyanate group, a hydrogen bond-forming group or the like. Or, after the synthesis of the block copolymer, $R^{11}$ can be reacted with a compound having such a substituent to add the substituent thereto. Also, after the synthesis of the block copolymer having such a substituent, $R^{11}$ can be reacted with a compound having a polymerizable group and a functional group that is reactive with the substituent to add the polymerizable group thereto. For example, a polymerizable group can be added to $R^{11}$ by reacting a block copolymer having a carboxyl group with glycidyl(meth)acrylate or by reacting a block copolymer having an isocyanate group with hydroxyethyl(meth)acrylate.

The number of the repeating units comprising the other block portion is not particularly limited. However, from the point of view that the sites having an affinity for the solvent and those having an affinity for the dye act effectively to improve the dispersibility of the dye dispersion liquid, the number is preferably 10 to 200, more preferably 10 to 100, still more preferably 10 to 70.

The other block portion is only required to be chosen so as to function as the site having an affinity for the solvent. The other block portion may be comprised of one kind of repeating unit or two or more kinds of repeating units. In the present invention, it is required that the repeating unit having a tertiary amine is contained as the block portion. When the other block portion comprises two or more kinds of repeating units, the two or more kinds of repeating units may be randomly arranged in the other block portion.

In the block polymer used as the dispersant of the present invention, from the viewpoint of dye dispersibility and dispersion stability, the ratio m/n is preferably in the range of 0.01 to 1, more preferably in the range of 0.05 to 0.7, in which "m" is the unit number of repeating units of the block portion comprising the repeating unit having a tertiary amine, and "n" is the unit number of repeating units of the other block portion.

The binding order of the block polymer is not limited as long as it has the block portion comprising a repeating unit having a tertiary amine and the other block portion and to be able to stably disperse the dye, and it is not particularly limited. It is preferable that the block portion comprising a repeating unit having a tertiary amine is bound to only one terminal end of the block polymer, from the viewpoint of excellent interaction with the dye and effective prevention of aggregation of dispersants.

The weight average molecular weight of the dispersant (B) is not particularly limited. However, from the viewpoint of obtaining excellent dispersibility, obtaining excellent heat resistance and light resistance, and improving re-dissolubility, the weight average molecular weight is preferably 2,500 to 20,000, more preferably 3,000 to 12,000, still more preferably 5,000 to 10,000.

The above weight average molecular weight Mw is a value measured by gel permeation chromatography (GPC). The measurement is carried out with HLC-8120GPC manufactured by Tosoh Corporation, using the following:

Elution solvent: N-methylpyrrolidone mixed with 0.01 mol/L lithium bromide

Polystyrene standard for calibration curve: Mw377400, 210500, 96000, 50400, 206500, 10850, 5460, 2930, 1300, 580 (Easi PS-2 series manufactured by Polymer Laboratories Ltd.) and Mw1090000 (manufactured by Tosoh Corporation)

Measurement column: Two measurement columns of TSK-GEL ALPHA-M (manufactured by Tosoh Corporation)

The amine value (b) of the dispersant (B) is not particularly limited. However, from the viewpoint of obtaining excellent dispersibility, obtaining excellent heat resistance and light resistance, and improving re-dissolubility and alkaline developability, the amine value is preferably 60 to 180 mg KOH/g, more preferably 70 to 170 mg KOH/g, still more preferably 80 to 160 mg KOH/g.

"Amine value" means the number of milligrams (mg) of potassium hydroxide which is equivalent to perchloric acid that is required to neutralize an amine component contained per gram of sample. It can be measured by the method defined in JIS-K7237.

From the viewpoint of improving dye dispersibility and dispersion stability, achieving higher luminance, obtaining excellent re-dissolubility in solvents and excellent alkaline developability, and being able to form a coating film with excellent heat resistance and light resistance, it is preferable to adjust the dye (A) having a sulfonic acid group and the dispersant (B) so that a ratio $\{(a \times Wa)/(b \times Wb)\}$ of a product of an acid value (a) [mg KOH/g] of the dye (A) having a sulfonic acid group and a solid content weight (Wa) [g] of the dye (A) to a product of an amine value (b) [mg KOH/g] of the dispersant (B) and a solid content weight (Wb) [g] of the dispersant (B), satisfies $0.45<(a \times Wa)/(b \times Wb) \leq 1$. It is particularly preferable that the ratio satisfies $0.5 \leq (a \times Wa)/(b \times Wb) \leq 1$.

The dispersant (B) may be one kind of dispersant or a combination of two or more kinds of dispersants.

In the dye dispersion liquid of the present invention, from the viewpoint of dye dispersibility and dispersion stability, the content of the dispersant (B) is generally in the range of 1 to 50% by weight, preferably in the range of 1 to 20% by weight, relative to the total amount of the dye dispersion liquid.

[Solvent (C)]

The solvent (C) used in the present invention is a solvent having a solubility of the dye (A) of 0.2 (g/100 g solvent) or less at 23° C. In the dye dispersion liquid of the present invention, by using such a solvent in which the dye is substantially insoluble or hardly soluble, the dye (A) can be dispersed in the solvent, in the form of fine particles. Preferably, the solvent (C) used in the present invention is a solvent having a solubility of the dye (A) of 0.10 (g/100 g solvent) or less at 23° C.

In the present invention, the solvent having a solubility of the dye (A) of 0.2 (g/100 g solvent) or less at 23° C., can be determined easily by the following evaluation method.

At first, it is possible to determine whether a solvent is one in which the dye (A) is substantially insoluble or not, by the following method.

First, 0.1 g of the dye (A) is put in a 20 mL sample tube. Then, a solvent S is put in the tube with a 10 ml whole pipette. The sample tube is capped and subjected to an ultrasonic treatment for three minutes. The thus-obtained solution is left to stand for 60 minutes in a water bath at 23° C. Then, 5 ml of the supernatant is filtered by a PTFE 5 µm membrane filter and then by a 0.25 µm membrane filter to remove undissolved substances therefrom. The thus-obtained filtrate is measured for absorption spectrum, using a 1 cm cell in an ultraviolet and visible spectrophotometer (for example, UV-2500PC manufactured by Shimadzu Corporation). Then, the absorbance (abs) of the dye at the maximum absorption wavelength is calculated. At this time, if the absorbance (abs) is less than 40% of the upper measurement limit (in the case of UV-2500PC manufactured by Shimadzu Corporation, if the absorbance (abs) is less than 2), the solvent can be evaluated as a solvent in which the dye is substantially insoluble. If the absorbance (abs) is 40% or more of the upper measurement limit, the solubility is obtained by the following evaluation method.

First, a filtrate is obtained in the same manner as mentioned above, except that a good solvent for the dye (e.g., alcohol such as methanol) is used instead of the solvent S, thus obtaining a dye solution. The dye solution is diluted 10,000 to 100,000 times appropriately, and then measured in the same manner for the absorbance at the maximum absorption wavelength of the dye. The solubility of the dye in the solvent S is calculated from the absorbance of the dye solution comprising the solvent S and the absorbance and dilution rate of the dye solution comprising the good solvent.

As a result, when the solvent has a dye solubility of 0.2 (g/100 g solvent) or less, it is determined to be a solvent in which the dye is hardly soluble and which is usable in the present invention.

The solvent used in the present invention is not particularly limited as long as it is a solvent having a solubility of the dye (A) of 0.2 (g/100 g solvent) or less at 23° C. It can be appropriately selected from solvents which are not reactive with the components in the dye dispersion liquid and which can dissolve or disperse them.

In the dye dispersion liquid of the present invention, from the viewpoint of dispersion stability, it is preferable to select the solvent appropriately from ester solvents.

Examples of ester solvents include ethyl acetate, butyl acetate, methyl methoxypropionate, ethyl ethoxypropionate, ethyl lactate, methoxyethyl acetate, propylene glycol monomethyl ether acetate, 3-methoxy-3-methyl-1-butyl acetate, 3-methoxybutyl acetate, methoxybutyl acetate, ethoxyethyl acetate, ethyl cellosolve acetate, dipropylene glycol methyl ether acetate, propylene glycol diacetate, 1,3-butylene glycol diacetate, cyclohexanol acetate, 1,6-hexanediol diacetate, diethylene glycol monoethyl ether acetate, and diethylene glycol monobutyl ether acetate.

From the viewpoint of low risk to human body and excellent heat-drying properties while having low volatility at or around room temperature, it is preferable to use propylene glycol monomethyl ether acetate (PGMEA). In this case, there is such an advantage that a special washing process is not needed when switched from a conventional PGMEA-containing photosensitive resin composition.

For the solvent used in the present invention, it is preferable that 50% by weight or more of the solvent (C) is propylene glycol monomethyl ether acetate, more preferably 70% by weight or more, still more preferably 90% by weight or more. It is particularly preferable that 100% by weight of the solvent is propylene glycol monomethyl ether acetate.

The above solvents may be used alone or in combination of two or more kinds.

The dye dispersion liquid of the present invention is prepared by using the above-described solvent at a ratio of generally 50 to 95% by weight, preferably 60 to 85% by weight, relative to the total amount of the dye dispersion liquid containing the solvent. When the solvent amount is too small, there is an increase in the viscosity of the dye dispersion liquid, and thus the dye dispersibility is likely to decrease. When the solvent amount is too large, there is a decrease in dye concentration and thus it may be difficult to achieve a target chromaticity coordinate after preparing the resin composition.

(Other Components)

The dye dispersion liquid of the present invention may further comprise a pigment, a dispersion assisting resin and other components, as needed, to the extent that does not impair the effects of the present invention.

A pigment is added to control color tone, as needed. It can be selected from conventionally-known pigments, according to the intended purpose. There may be used one kind of pigment or two or more kinds of pigments. The pigment content is not particularly limited, as long as it is within the range that does not impair the effects of the present invention. The pigment content may be the same as the photosensitive resin composition for color filters, which will be described below.

As the dispersion assisting resin, there may be mentioned an alkali-soluble resin for example, which will be described below under "Photosensitive resin composition for color filters". Dye particles become less likely to contact with each other due to steric hindrance by the alkali soluble resin, resulting in stabilization of particle dispersion, and the particle dispersion stabilization effect may be effective in reducing the dispersant.

Other components include a surfactant, which is used to increase wettability, a silane coupling agent, which is used to increase adhesion properties, a defoaming agent, a cissing inhibitor, an antioxidant, an aggregation inhibitor and an ultraviolet absorber, for example.

(Method for Producing the Dye Dispersion Liquid)

To produce the dye dispersion liquid of the present invention, there may be mentioned a method in which the dye (A) having a sulfonic acid group is prepared in advance and then the dye dispersion liquid is produced, and a method for preparing the dye dispersion liquid, in which, when preparing the dye dispersion liquid, a sulfonic acid salt of a dye having a sulfonic acid salt is converted to a sulfonic acid group to make the dye into the dye (A) having a sulfonic acid group.

In the case of the method in which the dye (A) having a sulfonic acid group is prepared in advance and then the dye dispersion liquid is produced, the dye dispersion liquid can be prepared as follows: the dispersant (B) is mixed with the solvent (C); the mixture is stirred to prepare a dispersant solution; the dispersant solution is mixed with the dye (A) and, as needed, other components; the mixture is dispersed by a known stirrer or disperser, thereby obtaining the dye dispersion liquid.

Also, the dye dispersion liquid can be produced as follows: the solvent (C) in which the dye (A) is substantially insoluble or hardly soluble, is mixed with the dispersant and stirred to prepare a dispersant solution; the dispersant solution is mixed with the dye (A) and, as needed, a good solvent for the dye; the mixture is stirred with a known stirrer or disperser and then subjected to a heating treatment, as needed; after the reaction is completed; the good solvent is removed from the resultant. The remaining product is the dye dispersion liquid.

Also, the dye dispersion liquid of the present invention can be produced as follows: the dye (A), the dispersant (B), the solvent (C) and a small amount of good solvent for the dye, are mixed together; the mixture is dispersed by a known stirrer or disperser; after the reaction is completed, the good solvent is removed from the resultant, thus obtaining the dye dispersion liquid of the present invention.

In the case of the method for preparing the dye dispersion liquid, in which, when preparing the dye dispersion liquid, a sulfonic acid salt of a dye having a sulfonic acid salt is converted to a sulfonic acid group to make the dye into the dye (A) having a sulfonic acid group, the production method is not particularly limited. For example, there may be mentioned the following method.

A dye having a sulfonic acid salt is dissolved in a good solvent for the dye, such as methanol or ethanol. An acid used for the acid treatment method is added thereto, such as concentrated hydrochloric acid. To the thus-obtained solution, the dispersant (B) and the solvent (C) having a solubility of the dye (A) of 0.2 (g/100 g solvent) or less at 23° C., such as propylene glycol monomethyl ether acetate (PGMEA), is added and heated. Then, the good solvent is removed therefrom by reduced-pressure distillation, etc. Moreover, precipitates are removed therefrom to obtain a filtrate, thereby producing the dye dispersion liquid of the present invention.

As the disperser for dispersion treatment, there may be mentioned roll mills such as a two-roll mill and a three-roll mill, ball mills such as a vibrating ball mill, paint conditioners, bead mills such as a continuous disk type bead mill and a continuous annular type bead mill, etc. In the case of using a bead mill, a preferred dispersion condition is that the diameter of used beads is 0.03 to 2.00 mm, more preferably 0.10 to 1.0 mm.

In particular, a preliminary dispersion is performed with 2 mm zirconia beads, which is a relatively large bead diameter, and then a main dispersion is performed with 0.1 mm zirconia beads, which is a relatively small bead diameter. It is preferable to perform filtration with a 0.5 to 0.1 µm membrane filter after the dispersion treatment.

The dye dispersion liquid is obtained in the manner described above, which has excellent dye particles dispersibility. The dye dispersion liquid is used as a pre-prepared product for preparing the photosensitive resin composition for color filters, which has excellent dye dispersibility.

2. Photosensitive Resin Composition for Color Filters

The photosensitive resin composition for color filters according to the present invention, comprises at least the dye dispersion liquid of the present invention and a photosensitive binder component (D).

The photosensitive resin composition for color filters according to the present invention, comprises the above-described dye dispersion liquid of the present invention. Therefore, it forms no aggregates in coating film formation, has excellent re-dissolubility in solvents and excellent alkaline developability, has excellent heat resistance and light resistance, is able to form a color layer with high luminance, and is also able to form a color filter with high luminance.

Hereinafter, the components used in the photosensitive resin composition for color filters will be described.

In the photosensitive resin composition for color filters of the present invention, the components which can be contained in the dye dispersion liquid of the present invention can be the same components as those described above under "Dye dispersion liquid", so that the components will not be described below.

[(D) Photosensitive Binder Component]

To provide sufficient strength, durability and adhesion properties to a coating film, a binder component which can cure the coating film by a polymerization reaction after forming a pattern on a substrate by coating or transfer, is used in the present invention. In addition to the below-described photosensitive binder component (D), there may be further used a thermosetting binder component which allows polymerization curing by heating, such as epoxy resin. In the production of the resin composition of the present invention using the dye dispersion liquid according to the present invention, in which the dye is dispersed, it is needed to appropriately select a binder component, in order not to impair dye dispersibility.

As the photosensitive binder component (D), there may be mentioned a negative photosensitive binder component which comprises a photocurable resin that can be polymerized and cured by light such as ultraviolet or electron beam, and which makes it possible to form a coating film pattern composed of an exposed area only, by curing the exposed area and dissolving and removing an unexposed area.

In the photosensitive resin composition for color filters according to the present invention, it is preferable to use the negative photosensitive binder component, from the point of view that a pattern can be easily formed by photolithography, using existing processes.

The negative photosensitive binder component comprising a photocurable resin that can be polymerized and cured by light such as ultraviolet or electron beam, is composed of (i) an alkali soluble resin, (ii) a polyfunctional monomer, (iii) a photopolymerization initiator, a sensitizer, etc.

(i) Alkali Soluble Resin

The alkali soluble resin in the present invention is one having a carboxyl group in a side chain thereof. It functions as a binder resin and can be appropriately selected and used as long as it is soluble in developing solutions used for pattern formation, particularly preferably alkali developing solutions.

The alkali soluble resin preferred in the present invention is a resin having a carboxyl group. Concrete examples thereof include acrylic copolymers having a carboxyl group and epoxy(meth)acrylate resins having a carboxyl group. Of these, particularly preferred is one having a carboxyl group and, moreover, a photopolymerizable functional group such as an ethylenically unsaturated group in a side chain thereof. This is because there is an increase in the hardness of the cured film thus formed, by containing the photopolymerizable functional group. These acrylic copolymers and epoxy (meth)acrylate resins can be used in combination of two or more kinds.

An acrylic copolymer having a carboxyl group is obtained by copolymerizing a carboxyl group-containing ethylenically unsaturated monomer and an ethylenically unsaturated monomer.

The acrylic copolymer having a carboxyl group may further comprise a constitutional unit having an aromatic carbon ring. The aromatic carbon ring functions as a component which imparts coatability to the resin composition.

The acrylic copolymer having a carboxyl group may further comprise a constitutional unit having an ester group. The constitutional unit having an ester group not only functions as a component which inhibits alkali solubility of the resin composition, but also functions as a component which increases solubility in solvents and re-dissolubility in solvents.

Examples of the acrylic copolymer having a carboxyl group include copolymers obtained from one or more kinds selected from the group consisting of: methyl (meth)acrylate, ethyl (meth)acrylate, n-propyl(meth)acrylate, isopropyl (meth)acrylate, n-butyl (meth)acrylate, sec-butyl (meth)acrylate, isobutyl (meth)acrylate, tert-butyl (meth)acrylate, n-pentyl(meth)acrylate, n-hexyl(meth)acrylate, 2-ethylhexyl (meth)acrylate, n-octyl(meth)acrylate, n-decyl(meth)acrylate, benzyl (meth)acrylate, phenyl(meth)acrylate, phenoxyethyl (meth)acrylate, cyclohexyl(meth)acrylate, isobornyl (meth)acrylate, dicyclopentanyl(meth)acrylate, 1-adamantyl (meth)acrylate, allyl(meth)acrylate, 2,2'-oxybis(methylene) bis-2-propenoate, styrene, γ-methylstyrene, glycidyl(meth) acrylate, 2-hydroxyethyl (meth)acrylate, 2-dimethylaminoethyl (meth)acrylate, N-vinyl-2-pyrrolidone, N-methylmaleimide, N-cyclohexylmaleimide, N-benzylmaleimide and N-phenylmaleimide; with one or more kinds selected from the group consisting of: (meth)acrylic acid, acrylic acid dimer (e.g., M-5600 manufactured by TOAGOSEI Co., Ltd.), itaconic acid, crotonic acid, maleic acid, fumaric acid, vinyl acetic acid and anhydrides thereof. Also, there may be mentioned polymers obtained by introducing an ethylenically unsaturated bond in the above copolymers by, for example, addition of an ethylenically unsaturated compound having a reactive functional group such as a glycidyl group or hydroxyl group. In the present invention, however, the acrylic copolymer having a carboxyl group is not limited to these examples.

Of these examples, the polymers obtained by introducing an ethylenically unsaturated bond in the above copolymers by, for example, addition of an ethylenically unsaturated compound having a glycidyl group or hydroxyl group, are particularly preferred from the point of view that polymerization with the below-described polyfunctional monomer is possible upon exposure and stable color layers can be obtained.

The copolymerization ratio of the carboxyl group-containing ethylenically unsaturated monomer in the carboxyl group-containing copolymer, is generally 5 to 50% by weight, preferably 10 to 40% by weight. When the copolymerization ratio of the carboxyl group-containing ethylenically unsaturated monomer is less than 5% by weight, there is a decrease in the solubility of the coating film thus obtained in alkali developing solutions, resulting in a difficulty with pattern formation. When the copolymerization ratio exceeds 50% by weight, upon development with an alkali developing solution, a pattern thus formed is likely to come off of the substrate or roughening of pattern surface is likely to occur.

The molecular weight of the carboxyl group-containing copolymer is preferably in the range of 1,000 to 500,000, more preferably in the range of 3,000 to 200,000. When the molecular weight is less than 1,000, there may be a remarkable decrease in binder function after curing. When the molecular weight exceeds 500,000, upon development with an alkali developing solution, pattern formation may be difficult.

The epoxy(meth)acrylate resin having a carboxyl group is not particularly limited. As the resin, however, an epoxy (meth)acrylate compound obtained by reaction of an acid anhydride with a reaction product of an epoxy compound and an unsaturated group-containing monocarboxylic acid, is suitable.

The epoxy compound is not particularly limited. Examples thereof include epoxy compounds such as bisphenol A type epoxy compounds, bisphenol F type epoxy compounds, bisphenol S type epoxy compounds, phenol novolac type epoxy compounds, cresol novolac type epoxy compounds, aliphatic epoxy compounds and bisphenol fluorene type epoxy compounds. They may be used alone or in combination of two or more kinds.

As the unsaturated group-containing monocarboxylic acid, for example, there may be mentioned (meth)acrylic acid, 2-(meth)acryloyloxyethyl succinic acid, 2-(meth)acryloyloxyethyl phthalic acid, (meth)acryloyloxyethyl hexahydrophtalic acid, (meth)acrylic acid dimer, β-furfuryl acrylic acid, β-styryl acrylic acid, cinnamic acid, crotonic acid and α-cyano cinnamic acid. These unsaturated group-containing monocarboxylic acids can be used alone or in combination of two or more kinds.

As the acid anhydride, there may be mentioned the following: dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endomethylene tetrahydrophthalic anhydride, methylendomethylene tetrahydrophthalic anhydride, chlorendic anhydride, methyltetrahydrophthalic anhydride; aromatic polycarboxylic acid anhydrides such as trimellitic anhydride, pyromellitic dianhydride, benzophenonetetracarboxylic dianhydride, biphenyltetracarboxylic dianhydride, biphenyl ether tetracarboxylic acid; and polycarboxylic acid anhydride derivatives such as 5-(2,5-dioxotetrahydrofuryl)-3-methyl-3-cyclohexen-1,2-dicarboxylic anhydride and endobicyclo-[2,2,1]-hepto-5-ene-2,3-dicarboxylic anhydride. They may be used alone or in combination of two or more kinds.

The molecular weight of the carboxyl group-containing epoxy(meth)acrylate compound obtained as above, is not particularly limited. However, it is preferably 1,000 to 40,000, more preferably 2,000 to 5,000.

(ii) Polyfunctional Monomer

In the present invention, examples of the polyfunctional monomer includes the following: di(meth)acrylates of alkylene glycols such as ethylene glycol and propylene glycol; di(meth)acrylates of polyalkylene glycols such as polyethylene glycol and polypropylene glycol; poly(meth)acrylates of trivalent or higher polyalcohols such as glycerin, trimethylolpropane, pentaerythritol and dipentaerythritol, and dicarboxylic acid-modified products thereof; oligo(meth)acrylates of resins such as polyester, epoxy resin, urethane resin, alkyd resin, silicone resin and spirane resin; di(meth)acrylates of both-hydroxyl-terminated polymers such as both-hydroxy-terminated poly-1,3-butadiene, both-hydroxy-terminated polyisoprene, and both-hydroxy-terminated polycaprolactone; and tris(2-(meth)acryloyloxyethyl)phosphate.

Of these polyfunctional monomers, preferred are poly(meth)acrylates of trivalent or higher polyalcohols, and dicarboxylic acid-modified products thereof. Concrete examples thereof include trimethylolpropane tri(meth)acrylate, pentaerythritol tri(meth)acrylate and succinic acid-modified products of pentaerythritol tri(meth)acrylate, pentaerythritol tetra(meth)acrylate, dipentaerythritol tetra(meth)acrylate, and dipentaerythritol hexa(meth)acrylate. These polyfunctional monomers may be used alone or in combination of two or more kinds.

The amount of the polyfunctional monomer used in the present invention is generally about 5 to 500 parts by weight, preferably 20 to 300 parts by weight, relative to 100 parts by weight of the alkali-soluble resin. When the content of the polyfunctional monomer is smaller than the range, photocuring may not proceed sufficiently and the photosensitive resin composition exposed to light may be melted. When the content of the polyfunctional monomer is larger than the range, there may be a decrease in alkaline developability.

(iii) Photopolymerization Initiator and Sensitizer

In general, a photopolymerization initiator is added to the negative photosensitive binder component, which is active to the wavelength of a light source used. The photopolymerization initiator is appropriately selected, considering the type of raw materials or the difference in reaction type between photopolymerizable polymers and monomers (e.g., radical polymerization, cationic polymerization), and it is not particularly limited.

Examples of photopolymerization initiators include compounds which produce free radicals by ultraviolet energy, such as biimidazole compounds, benzoin compounds, acetophenone compounds, benzophenone compounds, α-diketone compounds, polynuclear quinone compounds, xanthone compounds, thioxanthone compounds, triazine compounds, ketal compounds, azo compounds, peroxides, 2,3-dialkyldione compounds, disulfide compounds, thiuram compounds, fluoroamine compounds and oxime ester compounds. They can be used alone or in combination of two or more kinds.

The content of the photopolymerization initiator used in the photosensitive resin composition for color filters according to the present invention, is generally about 0.01 to 100 parts by weight, preferably 5 to 60 parts by weight, relative to 100 parts by weight of the polyfunctional monomer. When the content is smaller than the range, a sufficient polymerization reaction may not occur, so that the hardness of the color layer may not be sufficient. When the content is larger than the range, the content of pigments and so on in the solid content of the photosensitive resin composition for color filters is relatively small, so that sufficient color concentration may not be obtained.

Also in the present invention, as needed, one or more kinds selected from the group consisting of a sensitizer and a curing accelerator, may be used in combination with the photopolymerization initiator. Concrete examples of sensitizers include 4,4'-bis(dimethylamino)benzophenone, 4,4'-bis(diethylamino)benzophenone, 4-diethylaminoacetophenone, 4-dimethylaminopropiophenone, ethyl-4-dimethylaminobenzoate, 2-ethylhexyl-1,4-dimethylaminobenzoate, 2,5-bis(4-diethylaminobenzal)cyclohexanone, 7-diethylamino-3-(4-diethylaminobenzoyl)coumarin, and 4-(diethylamino)chalcone. Concrete examples of curing accelerators include chain transfer agents such as 2-mercaptobenzimidazole, 2-mercaptobenzothiazole, 2-mercaptobenzoxazole, 2,5-dimercapto-1,3,4-thiadiazole, 2-mercapto-4,6-dimethylaminopyridine, 1-phenyl-5-mercapto-1H-tetrazole, and 3-mercapto-4-methyl-4H-1,2,4-triazole.

(Pigment)

The photosensitive resin composition for color filters according to the present invention, may further comprise a pigment, as long as the chromaticity required of color filter applications and specifications can be achieved, and the effects of the present invention are not impaired. For example, there may be used an organic pigment, a natural colorant, etc. Concrete examples of organic pigments include compounds classified into Pigment in the Color Index (C.I.) issued by The Society of Dyers and Colourists.

Such compounds include the following pigments with Color Index (C.I.) numbers, for example: yellow pigments such as C.I. Pigment Yellow 1, C.I. Pigment Yellow 3, C.I. Pigment Yellow 12, C.I. Pigment Yellow 138, C.I. Pigment Yellow 139, C.I. Pigment Yellow 150, C.I. Pigment Yellow 180 and C.I. Pigment Yellow 185; red pigments such as C.I. Pigment Red 1, C.I. Pigment Red 2, C.I. Pigment Red 3, C.I. Pigment Red 242, C.I. Pigment Red 254 and C.I. Pigment Red 177; blue pigments such as C.I. Pigment Blue 15, C.I. Pigment Blue 15:3, C.I. Pigment Blue 15:4 and C.I. Pigment Blue 15:6; violet pigments such as C.I. Pigment Violet 23; and green pigments such as Pigment Green 36 and C.I. Pigment Green 58.

A lake pigment may be also used together. Concrete examples thereof include lake pigments such as C.I. Pigment Blue 1, C.I. Pigment Blue 1:2, C.I. Pigment Blue 9, C.I. Pigment Blue 14, C.I. Pigment Blue 24, C.I. Pigment Violet 3, C.I. Pigment Violet 3:1, C.I. Pigment Violet 3:3, C.I. Pigment Violet 27, C.I. Pigment Violet 39, C.I. Pigment Blue 78, C.I. Pigment Green 1, C.I. Pigment Green 2, C.I. Pigment Green 4, C.I. Pigment Blue 56, C.I. Pigment Blue 56:1, C.I. Pigment Blue 61, C.I. Pigment Blue 61:1, C.I. Pigment Blue 62, Pigment Violet 1, Pigment Violet 1:1, Pigment Violet 2, Pigment Violet 2:2, Pigment Red 81, Pigment Red 81:1, Pigment Red 81:2, Pigment Red 81:3, Pigment Red 81:4, Pigment Red 169 and Pigment Red 173. Examples of laking agents include phosphotungstic acid, phosphomolybdic acid, phosphotungsticmolybdic acid, copper phthalocyanine, molybdosilicic acid and aluminum.

Examples of inorganic colorants include inorganic pigments and extender pigments. Concrete examples thereof include titanium oxide, silica, barium sulfate, calcium carbonate, zinc oxide, lead sulfate, yellow lead, zinc yellow, red oxide (red iron(III) oxide), cadmium red, ultramarine blue, Prussian blue, chromium oxide green, cobalt green, amber, titanium black, synthetic iron black and carbon black.
(Other Dispersant)

In addition to the above-described pigment, the photosensitive resin composition color filters can further comprise a pigment, from the viewpoint of adjusting the chromaticity of color layers. To disperse the pigment, the dispersant used for the above-described dye dispersion liquid of the present invention, may be used; however, a different dispersant may be used to disperse the pigment, and a different pigment dispersant may be contained in the resin composition.

There is no particular limitation on the different dispersant. For example, applicable dispersants include cationic, anionic, nonionic, ampholytic, silicone-containing and fluorine-containing surfactants. Of surfactants, preferred are polymeric surfactants (polymer dispersants) as mentioned below. It is also possible to use a pigment derivative which is slightly soluble in solvents, as the different dispersant.

The dispersant is appropriately selected for use to disperse the pigment used. Concrete examples thereof include amide compounds such as nonanamide, decanamide, dodecanamide, N-dodecylhexadecanamide, N-octadecylpropionamide, N,N-dimethyldodecanamide and N,N-dihexylacetamide; amine compounds such as diethylamine, diheptylamine, dibutylhexadecylamine, N,N,N',N'-tetramethylmethanamine, triethylamine, tributylamine and trioctylamine; and hydroxy group-containing amines such as monoethanolamine, diethanolamine, triethanolamine, N,N,N',N'-(tetrahydroxyethyl)-1,2-diaminoethane, N,N,N'-tri(hydroxyethyl)-1,2-diaminoethane, N,N,N',N'-tetra(hydroxyethylpolyoxyethylene)-1,2-diaminoethane, 1,4-bis(2-hydroxyethyl)piperazine, and 1-(2-hydroxyethyl)piperazine. Also, there may be mentioned compounds such as nipecotamide, isonipecotamide and nicotinic acid amide.

In addition, there may be mentioned (co)polymers of unsaturated carboxylic esters such as polyacrylic acid ester; (partial) amine salts, (partial) ammonium salts or (partial) alkylamine salts of (co)polymers of unsaturated carboxylic acids such as polyacrylic acid; (co)polymers of hydroxyl group-containing unsaturated carboxylic esters such as hydroxyl group-containing polyacrylic acid ester, and modified products thereof; polyurethanes; unsaturated polyamides; polysiloxanes; long-chain polyaminoamide phosphates; and amide formed by reaction of poly(lower alkyleneimine) and free carboxyl group-containing polyester, and salts thereof.
(Optionally-Added Compounds)

As needed, the photosensitive resin composition for color filters according to the present invention, may further comprise various kinds of additives, as long as the object of the present invention is not impaired. Examples of additives include a polymerization terminator, a chain transfer agent, a leveling agent, a plasticizer, a surfactant, a defoaming agent, a silane coupling agent, an ultraviolet absorber and an adhesion enhancing agent.

Examples of surfactants that can be used in the present invention include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, fatty acid-modified polyesters and tertiary amine-modified polyurethanes. Also, there may be used a fluorine-containing surfactant.

Examples of plasticizers include dibutyl phthalate, dioctyl phthalate and tricresyl. As the defoaming agent and leveling agent, there may be mentioned silicone compounds, fluorine compounds, and acrylic compounds, for example.
<The Content of Each Component in the Resin Composition>

The total content of the dye and pigment is preferably 10 to 40% by weight, more preferably 15 to 35% by weight, relative to the total solid content of the resin composition. When the total content of the dye and pigment is too small, insufficient color concentration may be provided to the layer obtained by applying the resin composition to achieve a predetermined thickness (generally 1.0 to 4.0 μm). When the content of the pigment, etc., is too large, insufficient layer properties may be provided to the layer obtained by applying the resin composition to a substrate and curing the same, the properties including adhesion to the substrate, surface roughness and hardness of the layer. In addition, properties such as developability and heat resistance may be insufficient since the content ratio of the dispersant used for dispersion of the dye and pigment in the resin composition, is also large. In the present invention, "solid content" includes all the above-described components other than the solvent (C), and it also includes the polyfunctional monomer and the like dissolved in the solvent.

The total content of the dispersant is preferably in the range of 1 to 60% by weight, particularly preferably 5 to 80% by weight, relative to the total solid content of the photosensitive resin composition. When the content is less than 1% by weight, it may be difficult to homogeneously disperse the dye and pigment. When the content exceeds 80% by weight, there may be a decrease in curing and developing properties.

The total amount of the alkali soluble resin, the polyfunctional monomer and the photopolymerization initiator is 10 to 80% by weight, preferably 20 to 50% by weight, relative to the total solid content of the photosensitive resin composition.

The content of the solvent is not particularly limited as long as it allows color layer formation with accuracy. In general, the content is preferably in the range of 65 to 95% by weight, particularly preferably in the range of 75 to 88% by weight, relative to the total amount of the photosensitive resin composition including the solvent. When the content of the solvent is in the range, excellent coatability can be provided to the photosensitive resin composition.
(Production of the Photosensitive Resin Composition for Color Filters)

As the method for producing the photosensitive resin composition for color filters, for example, there may be mentioned (1) a method in which the above-described dye dispersion liquid of the present invention, the binder component (D) and various additives used as needed, are added to the solvent at the same time and mixed, and (2) a method in which the binder component (D) and various additives used as needed are added to the solvent and mixed; thereafter, the dye dispersion liquid of the present invention is added to the mixture and mixed.

When the pigment is used as needed to achieve a specific color tone required of the color layer of the color filter, it is preferable to prepare a different pigment dispersion liquid in advance, in the same manner as that of the above-described dye dispersion liquid of the present invention.

In this case, as the method for producing the resin composition of the present invention, there may be mentioned a method in which the dye dispersion liquid of the present invention, a different pigment dispersant liquid, the photosensitive binder component (D) and, as needed, a solvent and various additives are mixed together.

Next, the color filter of the present invention will be explained.

[Color Filter]

The color filter of the present invention comprises at least a transparent substrate and color layers, the color layers being present on the transparent substrate, wherein at least one of the color layers is a cured product of the photosensitive resin composition for color filters according to the present invention.

Such a color filter of the present invention will be explained, with reference to figures. FIG. 1 is a schematic cross-sectional view showing an example of the color filter of the present invention. FIG. 1 shows that a color filter 10 of the present invention comprises a transparent substrate 1, a light shielding part 2 and a color layer 3.

(Color Layer)

The color layers used in the color filter of the present invention are not particularly limited, as long as one of the layers is formed from the above-described photosensitive resin composition for color filters according to the present invention. However, the color layers are generally formed on an opening of the light shielding part on the below-described transparent substrate. Depending on the type of the pigment contained in the photosensitive resin composition, it is generally composed of color patterns in three or more colors.

The arrangement of the color layers is not particularly limited and may be a general arrangement such as a stripe type, a mosaic type, a triangle type or a four-pixel arrangement type. The width, area, etc., of the color layer can be determined appropriately.

The thickness of the color layer is appropriately controlled by controlling the applying method, solid content concentration, viscosity, etc., of the photosensitive resin composition for color filters. In general, the thickness is preferably in the range of 1 to 5 μm.

The color layer can be formed by the following method, for example.

First, the above-described photosensitive resin composition for color filters according to the present invention, is applied onto the below-described transparent substrate by a coating method to form a wet coating film. Examples of coating methods include a spray coating method, a dip coating method, a bar coating method, a roll coating method and a spin coating method.

Then, the wet coating film is dried with a hot plate or oven. The dried film is subjected to exposure through a mask with a given pattern to cause a photopolymerization reaction of the alkali-soluble resin, the polyfunctional monomer, etc., thereby obtaining a coating film of the photosensitive resin composition for color filters. Examples of light sources and lights that can be used for the exposure include a low pressure mercury lamp, a high pressure mercury lamp and a metal halide lamp, and ultraviolet rays and electron beams. The exposure amount is appropriately controlled, according to the used light source and the thickness of the coating film.

The film may be heated to promote the polymerization reaction after the exposure. The heating condition is appropriately determined, depending on the content ratio of the components used in the photosensitive resin composition for color filters, the thickness of the coating film, etc.

Next, the thus-obtained film is developed with a developing solution to dissolve and remove unexposed portions, thereby forming a coating film in a desired pattern. As the developing solution, a solution obtained by dissolving alkali in water or aqueous solvent, is generally used. An appropriate amount of surfactant, etc., may be added to the alkali solution. The developing method can be selected from general developing methods.

After the developing treatment, generally, the developing solution is rinsed off, followed by drying of the cured coating film of the photosensitive resin composition, thereby forming a color layer. To sufficiently cure the coating film, a heating treatment may be performed after the developing treatment. The heating condition is not particularly limited and appropriately determined depending on the intended use of the coating film.

(Light Shielding Part)

In the color filter of the present invention, the light shielding part is formed in pattern on the below-described transparent substrate and may be the same as those that are used as the light shielding part in general color filters.

The pattern shape of the light shielding part is not particularly limited, and examples thereof include a stripe-shaped pattern, a matrix-shaped patter, etc. As the light shielding pattern, for example, there may be mentioned one produced by dispersing or dissolving a black pigment in a binder resin, and thin metal layers of chromium, chromium oxide, etc. When the light shielding part is such a thin metal layer, the layer may be a stack of two layers of a $CrO_x$ layer ("x" is an arbitrary number) and a Cr layer, or may be a stack of three layers of a $CrO_x$ layer ("x" is an arbitrary number), a $CrN_y$ layer ("y" is an arbitrary number) and a Cr layer, the stack of three layers having a further reduced reflectance.

When the light shielding part is one produced by dispersing or dissolving a black colorant in a binder resin, the method for producing the light shielding part is not particularly limited and is only required to be a method which can pattern the light shielding part. For example, there may be mentioned a photolithography method using a photosensitive resin composition for the light shielding part, a printing method using the same, and an ink-jet method using the same.

In the case as described above and when using a printing method or ink-jet method to produce the light shielding part, as the binder resin, there may be mentioned polymethyl methacrylate resin, polyacrylate resin, polycarbonate resin, polyvinyl alcohol resin, polyvinylpyrrolidone resin, hydroxyethyl cellulose resin, carboxymethyl cellulose resin, polyvinyl chloride resin, melamine resin, phenol resin, alkyd resin, epoxy resin, polyurethane resin, polyester resin, maleic acid resin or polyamide resin, for example.

In the case as described above and when using a photolithography method to form the light shielding part, as the binder resin, there may be used reactive vinyl group-containing photosensitive resin such as acrylate-based, methacrylate-based, polyvinyl cinnamate-based or cyclized rubber-based photosensitive resin, for example. In this case, a photopolymerization initiator may be added to the photosensitive resin composition for forming the light shielding part, the composition comprising a photosensitive resin and, as a pigment, a black pigment such as carbon black and titanium black. In addition, a sensitizer, a coatability improving agent, a development modifier, a cross-linking agent, a polymerization inhibitor, a plasticizer, a flame retardant, etc., may be added thereto, as needed.

When the light shielding part is a thin metal layer, the method of forming such a light shielding part is not particularly limited, as long as the method allows patterning of the light shielding part. The examples include a photolithography method, a deposition method using a mask, and a printing method.

When the light shielding part is a thin metal layer, the thickness is about 0.2 to 0.4 μm. When the light shielding part is formed from the black pigment dispersed or dissolved in the binder resin, the thickness is about 0.5 to 2 μm.

(Transparent Substrate)

In the color filter of the present invention, the transparent substrate is not particularly limited, as long as it is a substrate that is transparent to visible light. It can be selected from general transparent substrates used in color filters. Concrete examples thereof include inflexible, transparent rigid materials such as silica glass plate, non-alkali glass plate and synthetic silica plate, and transparent, flexible materials such as transparent resin film and optical resin plates.

The thickness of the transparent substrate is not particularly limited. However, depending on the intended use of the color filter of the present invention, one having a thickness of about 100 μm to 1 mm can be used, for example.

In addition to the transparent substrate, the light shielding part and the color layer, the color filter of the present invention may also comprise an overcoat layer and a transparent electrode layer, for example. Moreover, it may further comprise an orientation layer, a columnar spacer, etc.

Next, the liquid crystal display device of the present invention will be explained.

[Liquid Crystal Display Device]

The liquid crystal display device of the present invention comprises the color filter, a counter substrate and a liquid crystal layer, the liquid crystal layer being present between the color filter and the counter substrate.

Figure 2:
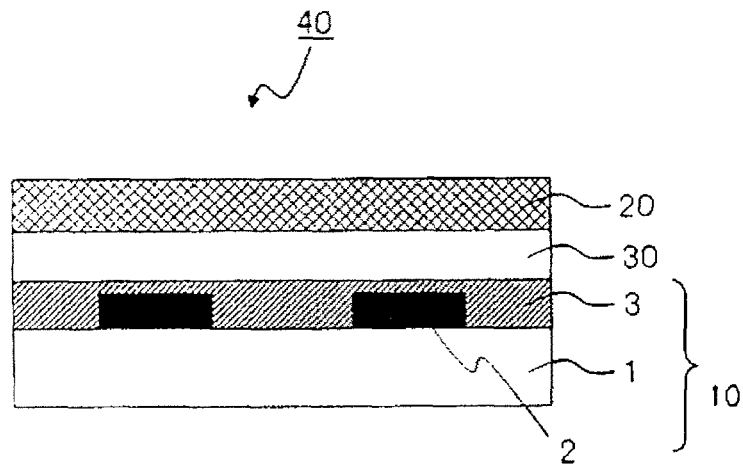
FIG. 2 is a schematic view showing an example of the liquid crystal display device according to the present invention.

Such a liquid crystal display device of the present invention will be explained with reference to figures. FIG. 2 is a schematic view showing an example of the liquid crystal display device of the present invention. As shown in FIG. 2, a liquid crystal display device 40, which is the liquid crystal display device of the present invention, comprises a color filter 10, a counter substrate 20 comprising a TFT array substrate, etc., and a liquid crystal layer 30 formed between the color filter 10 and the counter substrate 20.

The liquid crystal display device of the present invention is not limited to the configuration shown in FIG. 2. It can be a configuration which is generally known as a liquid crystal display device comprising a color filter.

The method for driving the liquid crystal display device of the present invention is not particularly limited and can be selected from driving methods which are generally used in liquid crystal display devices. Examples of such driving methods include a TN method, an IPS method, an OCB method and an MVA method. In the present invention, any of these methods can be suitably used.

The counter substrate can be appropriately selected depending on the driving method, etc., of the liquid crystal display device of the present invention.

Also, the liquid crystal of the liquid crystal layer can be selected from various liquid crystals with varying dielectric anisotropies and mixtures thereof, depending on the driving method, etc., of the liquid crystal display device of the present invention.

The method for forming the liquid crystal layer can be selected from methods which are generally used to produce liquid crystal cells. Examples thereof include a vacuum injection method and a liquid crystal dripping method.

In the vacuum injection method, for example, a liquid crystal cell is produced in advance, using a color filter and a counter substrate; liquid crystal is heated to become isotropic liquid; the liquid crystal is injected into the liquid crystal cell, in the form of isotropic liquid, using the capillary effect; the liquid crystal cell is encapsulated with an adhesive agent, thereby forming a liquid crystal layer. Then, the encapsulated liquid crystal can be oriented by gradually cooling the liquid crystal cell to room temperature.

In the liquid crystal dripping method, for example, a sealing agent is applied to the periphery of the color filter; the color filter is heated to the temperature at which the liquid crystal is in an isotropic phase; the liquid crystal is dripped in the form of isotropic liquid, using a dispenser, etc.; the color filter and the counter substrate are stacked under reduced pressure and then attached to each other with the applied sealing agent, thereby forming a liquid crystal layer. Then, the encapsulated liquid crystal can be oriented by gradually cooling the liquid crystal layer to room temperature.

Next, the organic light-emitting display device of the present invention will be explained.

[Organic Light-Emitting Display Device]

The organic light emitting display device of the present invention comprises the color filter of the present invention and an organic light emitting material.

Figure 3:
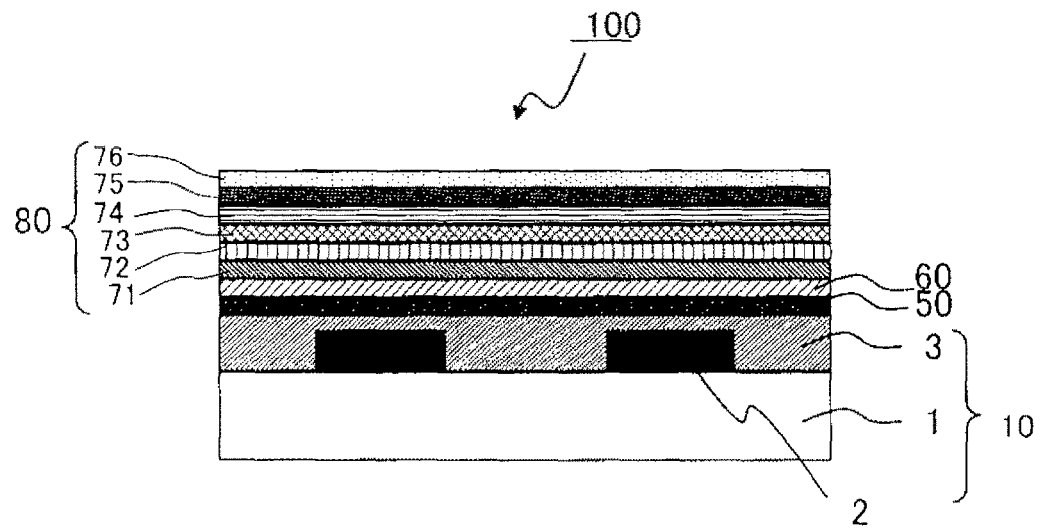
FIG. 3 is a schematic view showing an example of the organic light-emitting display device according to the present invention.

Such an organic light-emitting display device of the present invention will be explained with reference to figures. FIG. 3 is a schematic view showing an example of the organic light-emitting display device of the present invention. As shown in FIG. 3, an organic light-emitting display device 100, which is the organic light-emitting display device of the present invention, comprises a color filter 10 and an organic light-emitting material 80. An organic protection layer 50 and/or an inorganic oxide layer may be present between the color filter 10 and the organic light-emitting material 80.

As the method for stacking the components of the organic light-emitting material 80, for example, there may be mentioned a method of stacking the color filter, a transparent positive electrode 71, a positive hole injection layer 72, a positive hole transport layer 73, a light-emitting layer 74, an electron injection layer 75 and a negative electrode 76 in this sequence, and a method of attaching the organic light-emitting material 80 formed on a different substrate onto the inorganic oxide layer 60. In the organic light-emitting material 80, the transparent positive electrode 71, the positive hole injection layer 72, the positive hole transport layer 73, the light-emitting layer 74, the electron injection layer 75, the negative electrode 76 and other components may be selected from conventionally-known materials. The organic light-emitting display device 100 produced as above is applicable to both passive and active drive organic EL displays, for example.

The organic light-emitting display device of the present invention is not limited to the configuration shown in FIG. 3. It may have any one of configurations which are generally known as those of organic light-emitting display devices comprising a color filter.

EXAMPLES

Hereinafter, the present invention will be explained in detail, with reference to examples. The scope of the present invention is not restricted by these examples, however.

Test Example 1

Hydrochloric Acid Treatment of Acid Red 289

First, 2 g of Acid Red 289 (AR289 manufactured by Tokyo Chemical Industry Co., Ltd.) and then 10 g of 1-methoxy-2-propanol (manufactured by Kanto Chemical Co., Inc.) were put in a 20 mL sample tube. Next, 0.63 g of concentrated hydrochloric acid was gradually added thereto, followed by an ultrasonic treatment for five minutes. The thus-obtained solution was filtered by a 0.25 μm PTFE membrane. The thus-obtained filtrate was added dropwise to 300 g of PGMEA. The thus-precipitated, sulfonated dye was collected by filtration and dried to obtain a hydrochloric acid-treated product of Acid Red 289 (hereinafter may be referred to as AR289-H). The weight of the dried product was 1.69 g.

Test Example 2 p-Toluenesulfonic Acid Treatment of Acid Red 289

Acid Red 289 was treated in the same manner as test example 1, except that 0.28 g of p-toluenesulfonic acid monohydrate (hereinafter referred to as PTS, manufactured by Tokyo Chemical Industry Co., Ltd.) was added in place of the concentrated hydrochloric acid of 0.63 g. The weight of the dried product was 1.8 g. Hereinafter, the dried product will be referred to as AR289-TH.

<Evaluation: Insolubility of Dye in Solvent>

The above-obtained AR289-H and AR289-TH were evaluated for insolubility in PGMEA, in the manner mentioned below. First, 0.1 g of AR289-H or AR289-TH was put in a 20 mL sample tube. Then, 10 ml of PGMEA was put in the tube with a whole pipette. The sample tube was capped and subjected to an ultrasonic treatment for three minutes. The thus-obtained solution was left to stand for 60 minutes in a water bath at 23° C. Then, 5 ml of the supernatant was filtered by a PTFE 5 μm membrane filter and then by a 0.25 μm membrane filter to remove PGMEA-insoluble substances therefrom. The thus-obtained filtrate was measured for absorption spectrum, using a 1 cm cell in an ultraviolet and visible spectrophotometer (UV-2500PC manufactured by Shimadzu Corporation). Then, the absorbance (abs) of each dye at the maximum absorption wavelength was calculated. At this time, if the absorbance is less than 2, the solvent can be evaluated as a solvent in which the dye is substantially insoluble. The measurement wavelength for each dye and the absorbance (abs) of each dye are shown in Table 1. The measurement limit for absorbance by this measurement method was 0.005.

TABLE 1

| Dye | Weight [g] | Measurement wavelength [nm] | abs |
| --- | --- | --- | --- |
| AR289-H | 0.1003 | 542 | Less than 2 (0.005 or less) |
| AR289-TH | 0.1002 | 542 | Less than 2 (0.005 or less) |

<Evaluation: Measurement of Acid Value>

First, 0.10 g of AR289-H or AR289-TH was put in a 200 ml beaker and dissolved in 80 ml of ethanol. The resultant was titrated with a commercially-available potentiometric titrator (manufactured by Metrohm Japan Ltd.) and 0.1 mol/l potassium hydroxide ethanol solution. The results are shown in Table 2.

TABLE 2

| Dye | Weight [g] | Acid value [mg KOH/g] |
| --- | --- | --- |
| AR289-H | 0.1005 | 163 |
| AR289-TH | 0.1001 | 136 |

Comparative Production Example 1 and Production Examples 1 to 5

Preparation of Dye Dispersion Liquids Z-1 to Z-6

In a flask, 100 parts by weight of Acid Red 289 (AR289 manufactured by Tokyo Chemical Industry Co., Ltd.) was added to and dissolved in 1,000 parts by weight of methanol with a magnetic stirrer. After the dye was dissolved, as shown in Table 3, for Z2 to Z6 of Production Examples 1 to 5, concentrated hydrochloric acid or PTS was added and stirred, followed by further addition of 1,000 parts by weight of PGMEA. Then, a dispersant was added and stirred, which is LPN6919 (product name; manufactured by BYK Japan KK; a block polymer that contains a block portion comprising a repeating unit having a tertiary amine (containing a repeating unit represented by the above-mentioned formula (I') as the repeating unit having a tertiary amine, and a repeating unit represented by the above-mentioned formula (III') as a different repeating unit; nonvolatile content 60%; amine value 120 mg KOH/g; weight average molecular weight 8000). Thereafter, a reflux cooling tube was connected to the flask, and the temperature of the mixture in the flask was increased to 80° C. in a water bath. After reaching 80° C., the mixture was reacted for 4 hours. Then, using an evaporator, methanol was removed from the resultant by distillation in the water bath at 45° C. After adding 1,000 parts by weight of PGMEA to the resultant, the resultant was left to cool at room temperature for 16 hours. Then, precipitates were removed from the resultant by filtration and washed with PGMEA of about 100 parts by weight. The thus-obtained filtrate was collected and used as a dye dispersion liquid. The dye dispersion liquids obtained by this method were used as Z-1 to Z-6. More details on the raw materials for the dye dispersion liquids and the amounts are shown in Table 3. To determine the solid content in each dye dispersion liquid, some of the liquid was put on an aluminum petri dish, dried on a hot plate at 80° C. for 1 hour, and then dried under reduced pressure at 80° C. for 3 hours, thereby determining the solid content (wt %). The solid content results are also shown in Table 3.

In the case of the dye dispersion liquids Z-2 to Z-6 of Production Examples 1 to 5, a solution in which the dye was homogeneously dispersed, was obtained. In the case of the dye dispersion liquid Z-1 of Comparative Production Example 1, in which the dye remained a sulfonic acid salt, the dye was precipitated in the form of precipitates and failed to obtain a homogenous dye dispersion liquid.

<Evaluation of Dye Dispersion Liquid: Dye Dispersibility>

Figure 4:
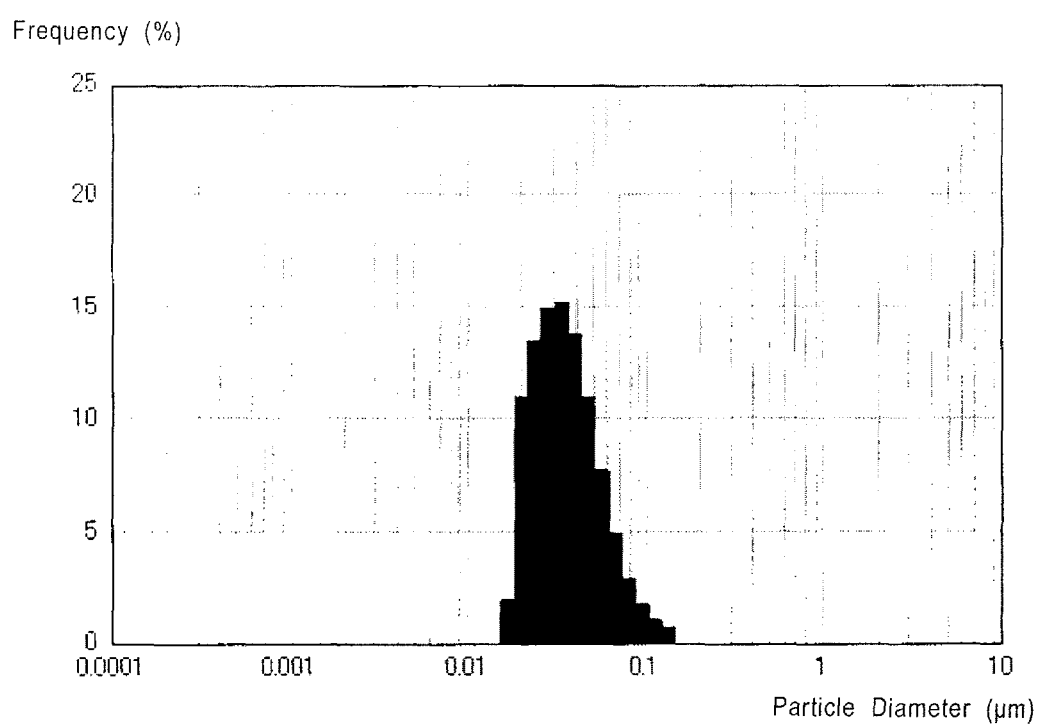
FIG. 4 is a chart showing the frequency analysis of a dye dispersion liquid Z-2, measured by a laser scattering particle size distribution analyzer.

The average dispersed particle diameter of the particles contained in each of the dye dispersion liquids Z-2 to Z-6, was measured. The particle diameter is estimated to be the average dispersed particle diameter of micelles formed by the dyes and the dispersants. The average dispersed particle diameter was measured as follows: the dye dispersion liquid was diluted 1,000 times with PGMEA, and then the average dispersed particle diameter was measured with a laser scattering particle size distribution analyzer (Nanotrac Particle Size Analyzer UPA-EX150 manufactured by Nikkiso Co., Ltd.) by dynamic light scattering at 23° C. The average dispersed particle diameter measured is volume average particle diameter (MV). The measurement results are shown in Table 3. FIG. 4 shows a frequency distribution chart of Z-2.

TABLE 3

| Dispersion liquid | | Dye | Part(s) by weight | Acid | Part(s) by weight | Dispersant | Part(s) by weight | MV [nm] | Solid content [wt %] |
|---|---|---|---|---|---|---|---|---|---|
| Comparative Production Example 1 | Z-1 | AR289 | 100 | — | 0.0 | LPN6919 | 467 | X (Dye precipitated) | — |
| Production Example 1 | Z-2 | AR289 | 100 | Concentrated hydrochloric acid | 30.0 | LPN6919 | 467 | 18.7 | 9.7 |
| Production Example 2 | Z-3 | AR289 | 100 | PTS | 56.2 | LPN6919 | 467 | 18.0 | 10.7 |
| Production Example 3 | Z-4 | AR289 | 100 | Concentrated hydrochloric acid | 30.0 | LPN6919 | 234 | 14.3 | 9.5 |
| Production Example 4 | Z-5 | AR289 | 100 | Concentrated hydrochloric acid | 30.0 | LPN6919 | 385 | 16.8 | 10.8 |
| Production Example 5 | Z-6 | AR289 | 100 | Concentrated hydrochloric acid | 30.0 | LPN6919 | 502 | 20.1 | 13.4 |

Table 4 shows the results calculated from "(a×Wa)/(b×Wb)" for Z-1 to Z-6. Herein, "(a×Wa)/(b×Wb)" is a ratio of a product of an acid value (a) [mg KOH/g] of the dye and a solid content weight (Wa) [part(s) by weight] of the dye to a product of an amine value (b) [mg KOH/g] of the dispersant and a solid content weight (Wb) [part(s) by weight] of the dispersant.

In Table 4, the solid content weight (Wb) of the dispersant is expressed as the solid content weight recalculated on the condition that the solid content weight (Wa) of the sulfonated dye AR289-H or AR289-TH is 100 parts by weight.

TABLE 4

| Dispersion liquid | Dye | Acid value (a) [mg KOH/g] | Solid content weight (Wa) [Part(s) by weight] | Dispersant | Amine value (b) [mg KOH/g] | Solid content weight (Wb) [Part(s) by weight] | (a × Wa)/(b × Wb) |
|---|---|---|---|---|---|---|---|
| Z-1 | AR289 | 0 | 100 | LPN6919 | 120 | 276 | 0.00 |
| Z-2 | AR289-H | 163 | 100 | LPN6919 | 120 | 271 | 0.50 |
| Z-3 | AR289-TH | 136 | 100 | LPN6919 | 120 | 226 | 0.50 |
| Z-4 | AR289-H | 163 | 100 | LPN6919 | 120 | 136 | 1.00 |
| Z-5 | AR289-H | 163 | 100 | LPN6919 | 120 | 223 | 0.61 |
| Z-6 | AR289-H | 163 | 100 | LPN6919 | 120 | 291 | 0.47 |

Comparative Synthesis Example 1

Synthesis of Salt Forming Compound (A-1)

First, 100 parts by weight of AR289 was added to and dissolved in 1,000 parts by weight of methanol. Then, 120 parts by weight of 10% sodium hydroxide aqueous solution was added thereto. Then, 173.6 parts by weight of distearyl dimethyl ammonium chloride (manufactured by Tokyo Chemical Industry Co., Ltd.) and 1,000 parts by weight of methanol were added thereto. After connected to a reflux cooling tube, the temperature of the mixture was increased to 80° C. in a water bath, and the mixture was reacted for 4 hours. Next, methanol was removed therefrom with an evaporator. The resultant was extracted with 2,000 parts by weight of methyl isobutyl ketone, followed by filtration and then drying, thus obtaining the salt-forming compound (A-1).

Comparative Production Example 2

Preparation of Salt-Forming Compound Resin Solution (DA-1)

First, 70.0 parts by weight of cyclohexanone was put in a reaction container, which is a separable four-necked flask equipped with a thermometer, cooling tube, nitrogen gas inlet tube and stirrer. The container temperature was increased to 80° C. to replace the air inside the container by nitrogen. Then, a mixture of 13.3 parts by weight of n-butyl methacrylate, 4.6 parts by weight of 2-hydroxyethyl methacrylate, 4.3 parts by weight of methacrylic acid, 7.4 parts by weight of para-cumylphenol ethylene oxide-modified acrylate ("ARONIX M110" manufactured by Toagosei Co., Ltd.) and 0.4 part by weight of 2,2'-azobisisobutyronitrile, was added dropwise to the cyclohexanone in the reaction container, for 2 hours using a dropping funnel. After the addition was completed, the reaction was kept for another 3 hours, thus obtaining an acrylic resin solution (AR-1) having a weight average molecular weight (Mw) of 20,000.

The salt-forming compound (A-1) was added to the acrylic resin solution (AR-1) and mixed homogeneously by stirring, thus obtaining the salt-forming compound resin solution (DA-1) of Comparative Production Example 2.

(Preparation of Photosensitive Binder Compound (CR-1))

The photosensitive binder compound (CR-1) was obtained by mixing the following raw materials, homogeneously:

Alkali soluble resin: 100 Parts by weight of methacrylic acid/methyl methacrylate/benzyl methacrylate copolymer (mole ratio 10/30/50, weight average molecular weight 9,000, acid value 70 mg KOH/g, active component content 40% by weight)

Polyfunctional monomer: 60 Parts by weight of dipentaerythritol hexaacrylate ("KAYARAD DPHA" manufactured by Nippon Kayaku Co., Ltd.)

Photopolymerization initiator: 11.1 Parts by weight of 2-methyl-1-[4-(methylthio)phenyl]-2-morpholinopropane-1-one ("IRGACURE 907" manufactured by Ciba Specialty Chemicals, Inc.) and 3.7 parts by weight of diethylthioxanthone ("DETX-S" manufactured by Nippon Kayaku Co., Ltd.)

Solvent: 172.2 Parts by weight of PGMEA (Preparation of Blue Pigment Dispersion Liquid (B-1))

First, the following raw materials and 1,000 parts by weight of zirconia beads were put in a mayonnaise jar, the beads having a diameter of 2.0 mm.

Pigment dispersant: 75 Parts by weight of LPN21116 (manufactured by BYK Japan KK, nonvolatile content 40%)

Pigment: 100 Parts by weight of commercially-available Pigment Blue 15:6 pigment (PB15:6)

Alkali soluble resin: 125 Parts by weight of methacrylic acid/methyl methacrylate/benzyl methacrylate copolymer (mole ratio 10/30/50, weight average molecular weight 9,000, acid value 70 mg KOH/g, active component content 40% by weight)

Solvent: 700 Parts by weight of PGMEA

The jar was shaken with a paint shaker (manufactured by Asada Iron Works Co., Ltd.) for 1 hour, which is a preliminary grind process. Then, the zirconia beads were changed to 1,000 parts of zirconia beads having a diameter of 0.1 mm, and the mixture was dispersed for 4 hours with the paint shaker, which is the main grind process, thus preparing the blue pigment dispersion liquid (B-1).

(Preparation of Violet Pigment Dispersion Liquid (V-1))

First, the following raw materials and 1,000 parts by weight of zirconia beads were put in a mayonnaise jar, the beads having a diameter of 2.0 mm.

Pigment dispersant: 250 Parts by weight of PN21116 (manufactured by BYK Japan KK, nonvolatile content 40%)

Pigment: 100 Parts by weight of commercially-available Pigment Violet 23 pigment (PV23)

Solvent: 1,650 Parts by weight of PGMEA

The jar was shaken with a paint shaker (manufactured by Asada Iron Works Co., Ltd.) for 1 hour, which is a preliminary grind process. Then, the zirconia beads were changed to 1,000 parts by weight of zirconia beads having a diameter of 0.1 mm, and the mixture was dispersed for 6 hours with the paint shaker, which is the main grind process, thus preparing the violet pigment dispersion liquid (V-1).

Example

Preparation of Photosensitive Resin Compositions

The components prepared above were mixed as shown in Table 5, diluted with PGMEA to have a solid content of 20% or less, and then filtered with a 5.0 μm membrane filter, thus obtaining photosensitive resin compositions X-1 to X-11 of Examples and Comparative Examples.

For X-6, X-7, X-9 and X-10, precipitates were found when mixed with the photosensitive binder component (CR-1), so that cyclohexanone was further added so as to have a solid content of 10%.

TABLE 5

|  | Photosensitive resin composition | Dye dispersion liquid (Salt-forming compound) | Solid content [Part(s) by weight] | Pigment dispersion liquid | Solid content [Part(s) by weight] | Photosensitive binder component | Solid content [Part(s) by weight] |
|---|---|---|---|---|---|---|---|
| Example 1 | X-1 | Z-2 | 48.6 |  |  | CR-1 | 51.4 |
| Example 2 | X-2 | Z-3 | 42.8 |  |  | CR-1 | 57.2 |
| Example 3 | X-3 | Z-4 | 30.9 |  |  | CR-1 | 69.1 |
| Example 4 | X-4 | Z-5 | 42.4 |  |  | CR-1 | 57.6 |
| Example 5 | X-5 | Z-6 | 51.3 |  |  | CR-1 | 48.7 |
| Comparative Example 1 | X-6 | DA-1 | 56.3 |  |  | CR-1 | 43.7 |
| Comparative Example 2 | X-7 | A-1 | 18.2 |  |  | CR-1 | 81.8 |
| Example 6 | X-8 | Z-2 | 14.6 | B-1 | 33.6 | CR-1 | 51.8 |
| Comparative Example 3 | X-9 | DA-1 | 11.5 | B-1 | 48.8 | CR-1 | 39.8 |
| Comparative Example 4 | X-10 | A-1 | 3.4 | B-1 | 49.8 | CR-1 | 46.8 |
| Comparative Example 5 | X-11 |  |  | B-1/V-1 | 27.7/13.2 | CR-1 | 59.1 |

<Evaluation of Resin Compositions>

Each of the thus-obtained photosensitive resin compositions for color filters of Examples 1 to 6 and Comparative Examples 1 to 5, was applied onto a glass substrate ("NA35" manufactured by NH Techno Glass Corporation) with a spin coater and then dried on a hot plate at 80° C. for 3 minutes, thereby obtaining an applied substrate on which a 2.0 μm-thick dried coating film was formed. For each of the thus-obtained applied substrates, the presence of aggregates in the dried coating film was checked. Also, a re-dissolubility test was performed on the dried coating films. The results are shown in Table 6.

[Criterion for Evaluating Aggregates in the Dried Coating Film]

o: No aggregates were visually confirmed.

x: Aggregates were visually confirmed.

[Evaluation Criterion of Re-Dissolubility Test]

Each of the obtained applied substrate was immersed in a PGMEA solution for 1 minutes and then removed therefrom to see if the coating film was dissolved or not.

o: An undissolved residue of the coating film was not left.

x: An undissolved residue of the coating film was left.

As shown by Examples 1 to 6, the resin composition comprising the dye dispersion liquid formed no aggregates in the formation of the dried coating film. On the other hand, as shown by Comparative Examples 1 to 4, the resin composition comprising the salt-forming compound formed aggregates in the formation of the dried coating film, which is not suitable as a color layer for color filters.

The coating films of Comparative Examples 1 to 5 had low re-dissolubility in the solvent. In the case of Comparative Example 5, to achieve a desired color tone, it was needed to add a large amount of PV23 pigment; moreover, a large amount of dispersant was also used. Therefore, it is presumed that there is a decrease in re-dissolubility.

<Photocurability Test and Heat Resistance Test>

For each of Examples 1 to 6 and Comparative Example (that is, excluding Comparative Examples 1 to 4 that formed aggregates in the dried coating film and were considered unsuitable as a photosensitive resin composition for color filters), another dried coating film having a thickness of 2.0 μm was formed and entirely exposed to 60 mJ/cm² ultraviolet radiation, using an ultra high pressure mercury lamp and not through a photomask. The thus-obtained exposed film (color film) was subjected to the photocurability test. Then, the color film was measured for $L_0$, $a_0$, $b_0$, using microscopic spectrophotometer "OSP-SP200" manufactured by Olympus Corporation.

The substrate having the color film formed thereon, was subjected to post-baking for 30 minutes in a clean oven at 230° C. The thus-obtained color film was measured again for L, a, b, which will be referred to as $L_1$, $a_1$, $b_1$.

<Alkali Developability Test>

For each of Examples 1 to 6 and Comparative Example 5 (that is, excluding Comparative Examples 1 to 4 that were considered unsuitable as a photosensitive resin composition for color filters), a color layer was formed as follows: the photosensitive resin composition for color filters was applied onto a 0.7 mm-thick, 10 mm×10 mm glass substrate, using a spin coater, so as to have a thickness of 2.0 μm after post-baking, and then was dried for 3 minutes on a hot plate at 80° C., thereby forming a color layer. Then, the glass plate having the color layer formed thereon, was subjected to shower development in an alkali developing solution (0.05% by mass potassium hydroxide aqueous solution). The time required for absolute dissolution of the color layer and appearance of the glass plate surface in the area where the color layer had been formed, was measured as "developing time".

[Evaluation Criterion of Photocurability Test]
○: No mark was left on the exposed film after touching the film with a finger.
×: A mark was left on the exposed film after touching the film with a finger.

[Evaluation Criterion of Heat Resistance Test]
The value of ΔEab was calculated from the following formula:

$$\Delta Eab = \{(L_1-L_0)^2+(a_1-a_0)^2+(b_1-b_0)^2\}^{1/2}$$

○: The value of ΔEab is less than 5.
×: The value of ΔEab is 5 or more.

[Evaluation Criterion of Alkali Developability Test]
From the viewpoint of productivity, there is no problem if the developing time is within 30 seconds. A developing time of more than 30 seconds results in poor productivity and is not preferable.

The results of the tests are shown in Table 6.

TABLE 6

|  | Resist | Aggregates in dried coating film | Re-dissolubility test | Photocurability | Heat resistance (ΔEab) | Developing time [sec] |
|---|---|---|---|---|---|---|
| Example 1 | X-1 | ○ | ○ | ○ | ○ | 20 |
| Example 2 | X-2 | ○ | ○ | ○ | ○ | 19 |
| Example 3 | X-3 | ○ | ○ | ○ | ○ | 20 |
| Example 4 | X-4 | ○ | ○ | ○ | ○ | 15 |
| Example 5 | X-5 | ○ | ○ | ○ | ○ | 20 |
| Comparative Example 1 | X-6 | × | × | — | — | — |
| Comparative Example 2 | X-7 | × | × | — | — | — |
| Example 6 | X-8 | ○ | ○ | ○ | ○ | 20 |
| Comparative Example 3 | X-9 | × | × | — | — | — |
| Comparative Example 4 | X-10 | × | × | — | — | — |
| Comparative Example 5 | X-11 | ○ | × | ○ | ○ | 20 |

<Optical Characterization, Heat Resistance Test 2 and Light Resistance Test>

The optical characterization, heat resistance test 2 and heat resistance test were performed on Example 6 and Comparative Example 5.

The optical characterization was performed as follows. Each of the photosensitive resin compositions of Example 6 and Comparative Example 5 was applied onto a 0.7 mm-thick glass substrate ("NA35" manufactured by NH Techno Glass Corporation) with a spin coater, heat-dried for 3 minutes on a hot plate at 80° C., and then exposed to 60 mJ/cm² ultraviolet radiation with an ultra high pressure mercury lamp, thereby obtaining a cured film (blue color film). The thickness (T; μm) of the film after dried and cured was adjusted so as to have a target chromaticity (x=0.144, y=0.073). The glass plate having the color layer formed thereon, was subjected to post-baking for 30 minutes in a clean oven at 230° C. The thus-obtained color film was measured for contrast, chromaticity (x, y) and luminance (Y). The contrast was measured with contrast measuring device "CT-1B" manufactured by Tsubosaka Electric Co., Ltd. The chromaticity and luminance were measured with microscopic spectrophotometer "OSP-SP200" manufactured by Olympus Corporation.

The results are shown in Table 7.

[Evaluation Criterion of Heat Resistance Test 2]

The substrate subjected to post-baking was further baked for 60 minutes in a clean oven at 230° C. (additional baking). The thus-obtained color film was measured again for L, a, b, which will be referred to as $L_2$, $a_2$, $b_2$. ΔEab can be calculated from the following formula:

$$\Delta Eab = \{(L_2-L_1)^2+(a_2-a_1)^2+(b_2-b_1)^2\}^{1/2}$$

[Evaluation Criterion of Light Resistance Test]

Another substrate prepared in the same manner as the optical characterization and subjected to post-baking, was prepared. The substrate was subjected to irradiation with a high pressure mercury lamp (11 mW/cm² at a wavelength of 254 nm) for 91 seconds under atmospheric pressure. The thus-obtained color film was measured again for L, a, b, which will be referred to as $L_3$, $a_3$, $b_3$. ΔEab can be calculated from the following formula:

$$\Delta Eab = \{(L_3-L_1)^2+(a_3-a_1)^2+(b_3-b_1)^2\}^{1/2}$$

TABLE 7

|  | x | y | Y | Contrast | Film thickness (T) (μm) | Heat resistance 2 (ΔEab) | Light resistance (ΔEab) |
|---|---|---|---|---|---|---|---|
| Example 6 | 0.144 | 0.073 | 7.89 | 4,850 | 2.15 | 4.3 | 2.3 |
| Comparative Example 5 | 0.144 | 0.073 | 7.34 | 3,579 | 2.20 | 4.0 | 1.0 |

From these results, the following is clear: compared to Comparative Example 5 (the photosensitive resin composition comprising conventional Pigment Blue 15:6 and Pigment Violet 23 pigments), Example 6 (the present invention) is excellent in luminance and contrast; the heat resistance resulting from additional baking is equivalent to Comparative Example 5; although the light resistance is slightly inferior to Comparative Example 5, ΔEab is below 3; therefore, Example 6 is able to meet product specifications, sufficiently.

From the above results, it is clear that the photosensitive resin composition for color filters according to the present invention, forms no aggregates in coating film formation, has excellent coating film forming property, has excellent alkali developability and photocurability, has excellent heat resistance although it contains a dye, and has excellent re-dissolubility in solvents.

REFERENCE SIGNS LIST

1. Transparent substrate
2. Light shielding part
3. Color layer
10. Color filter
20. Counter substrate
30. Liquid crystal layer
40. Liquid crystal display device
50. Organic protection layer
60. Inorganic oxide layer
71. Transparent positive electrode
72. Positive hole injection layer
73. Positive hole transport layer
74. Light-emitting layer
75. Electron injection layer
76. Negative electrode
80. Organic light-emitting material
100. Organic light-emitting display device

The invention claimed is:

1. A dye dispersion liquid comprising a dye (A), a dispersant (B) and a solvent (C), the dye (A) being dispersed in the solvent (C) by the dispersant (B), wherein the dye (A) is a dye having a sulfonic acid group; the dispersant (B) is a block polymer that contains a block portion comprising a repeating unit having a tertiary amine represented by the following formula (I) and a block portion comprising a repeating unit represented by the following formula (III); the solvent (C) is a solvent having a solubility of the dye (A) of 0.2 (g/100 g solvent) or less at 23° C.; and a micelle is formed by an acid-base interaction between the tertiary amine of the dispersant (B) and the sulfonic acid group of the dye (A);

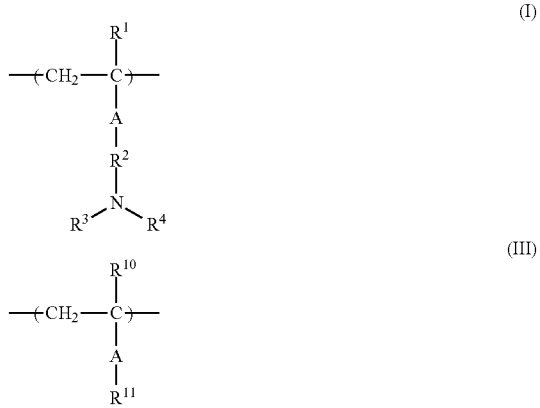

wherein in the formula (I), $R^1$ is a hydrogen atom or a methyl group; "A" is a direct bond or a divalent linking group; $R^2$ is an alkylene group having 1 to 8 carbon atoms or a divalent organic group described by —[CH($R^6$)—CH($R^7$)—O]$_x$—CH($R^6$)—CH($R^7$)— or —[(CH$_2$)$_y$—O]$_z$—(CH$_2$)$_y$—; each of $R^3$ and $R^4$ is independently a chain and/or cyclic hydrocarbon group which can be substituted, or $R^3$ and $R^4$ are bound to each other to form a cyclic structure; each of $R^6$ and $R^7$ is independently a hydrogen atom or a methyl group; "x" is an integer of 1 to 18; "y" is an integer of 1 to 5; and "z" is an integer of 1 to 18;

in the formula (III), $R^{10}$ is a hydrogen atom or a methyl group; "A" is a direct bond or a divalent linking group; $R^{11}$ is one selected from the group consisting of an alkyl group having 1 to 18 carbon atoms, an alkenyl group having 2 to 18 carbon atoms, an aralkyl group, an aryl group and a monovalent group described by —[CH($R^{12}$)—CH($R^{13}$)—O]$_x$—$R^{14}$ or —[(CH$_2$)$_y$—O]$_z$—$R^{14}$; each of $R^{12}$ and $R^{13}$ is independently a hydrogen atom or a methyl group; $R^{14}$ is one selected from the group consisting of a hydrogen atom, an alkyl group having 1 to 18 carbon atoms, an alkenyl group having 2 to 18 carbon atoms, an aralkyl group, an aryl group and a monovalent group described by —CHO, —CH$_2$CHO or —$CH_2COOR^{15}$; $R^{15}$ is a hydrogen atom or a straight-chain, branched or cyclic alkyl group having 1 to 5 carbon atoms; "x" is an integer of 1 to 18; "y" is an integer of 1 to 5; and "z" is an integer of 1 to 18.

2. The dye dispersion liquid according to claim 1, wherein a ratio of a product of an acid value (a) [mg KOH/g] of the dye (A) having a sulfonic acid group and a solid content weight (Wa) [g] of the dye (A) to a product of an amine value (b) [mg KOH/g] of the dispersant (B) and a solid content weight (Wb) [g] of the dispersant (B), satisfies $0.45 < (a \times Wa)/(b \times Wb) \le 1$.

3. The dye dispersion liquid according to 1, wherein the amine value (b) of the dispersant (B) is 60 to 180 mg KOH/g.

4. The dye dispersion liquid according to claim 1, wherein the dye (A) is a dye comprising xanthene, anthraquinone or phthalocyanine as a basic skeleton and having a sulfonic acid group.

5. The dye dispersion liquid according to claim 1, wherein a number of the repeating units having a tertiary amine in the block polymer is 3 to 50, the block polymer being the dispersant (B).

6. The dye dispersion liquid according to claim 1, wherein the dye (A) is a dye having a sulfonic acid group converted from at least one sulfonic acid salt of at least one kind of dye selected from the group consisting of Acid Red 289, Acid Violet 43, Acid Green 25 and Direct Blue 86.

7. The dye dispersion liquid according to claim 1, wherein 50% by weight or more of the solvent (C) is propylene glycol monomethyl ether acetate.

8. A photosensitive resin composition for color filters, comprising at least the dye dispersion liquid defined by claim 1 and a photosensitive binder component (D).

9. A color filter comprising at least a transparent substrate and color layers, the color layers being present on the transparent substrate, wherein at least one of the color layers is a cured product of the photosensitive resin composition for color filters defined by claim 8.

10. A liquid crystal display device comprising the color filter defined by claim 9, a counter substrate and a liquid crystal layer, the liquid crystal layer being present between the color filter and the counter substrate.

11. An organic light emitting display device comprising the color filter defined by claim 9 and an organic light emitting material.

* * * * *